United States Patent
Oh et al.

(10) Patent No.: US 12,308,082 B2
(45) Date of Patent: May 20, 2025

(54) SEMICONDUCTOR MEMORY DEVICES THAT SUPPORT ENHANCED DATA RECOVERY OPERATIONS

(71) Applicant: Samsung Electronics Co., Ltd., Suwon-si (KR)

(72) Inventors: Seungjun Oh, Suwon-si (KR); Seong Geon Lee, Suwon-si (KR); Dae-Won Kim, Suwon-si (KR); Kyungduk Lee, Suwon-si (KR); Youn-Soo Cheon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/302,034

(22) Filed: Apr. 18, 2023

(65) Prior Publication Data

US 2024/0071545 A1    Feb. 29, 2024

(30) Foreign Application Priority Data

Aug. 24, 2022 (KR) .................. 10-2022-0106203

(51) Int. Cl.
| | | |
|---|---|---|
| *G11C 29/12* | (2006.01) | |
| *G06F 11/00* | (2006.01) | |
| *G11C 29/00* | (2006.01) | |
| *G11C 29/42* | (2006.01) | |

(52) U.S. Cl.
CPC ........ *G11C 29/12005* (2013.01); *G11C 29/42* (2013.01); *G11C 2029/1202* (2013.01)

(58) Field of Classification Search
CPC ............ G11C 29/12005; G11C 29/028; G11C 29/021; G11C 16/26; G11C 11/5642; G11C 16/08; G11C 29/42; G11C 2029/1202; G06F 3/0614; G06F 11/1048
See application file for complete search history.

(56) References Cited

U.S. PATENT DOCUMENTS

| | | |
|---|---|---|
| 8,689,082 B2 | 4/2014 | Oh et al. |
| 8,929,140 B2 | 1/2015 | Nagashima |
| 8,995,213 B2 | 3/2015 | Song |
| 9,524,786 B2 | 12/2016 | Nagashima |
| 9,767,913 B2 | 9/2017 | Nagashima |
| 10,020,063 B2 | 7/2018 | Nagashima |
| 10,373,692 B2 | 8/2019 | Nagashima |

(Continued)

FOREIGN PATENT DOCUMENTS

| | | |
|---|---|---|
| JP | 5349256 B2 | 8/2013 |
| KR | 20110078727 A | 7/2011 |

(Continued)

*Primary Examiner* — Justin R Knapp
(74) *Attorney, Agent, or Firm* — Myers Bigel, P.A.

(57) ABSTRACT

A method of operating a memory device includes reading a first page of memory cells containing at least one worn-out memory cell therein using a read voltage, from a first memory block, and reading a second page of memory cells, which extends adjacent to the first page in the first memory block, using the read voltage. An operation is performed to determine a match rate between a position of a column including a "0" bit in the first page with a position of a column including a "0" bit in the second page. Thereafter, the second page is read by adjusting a read pass voltage applied to a word line of another page in the first memory block, when the match rate exceeds a threshold match rate.

16 Claims, 15 Drawing Sheets

(56) References Cited

U.S. PATENT DOCUMENTS

| | | | |
|---|---|---|---|
| 10,580,486 B2 | 3/2020 | Kim et al. | |
| 10,790,035 B2 | 9/2020 | Choi et al. | |
| 10,916,312 B2 | 2/2021 | Nagashima | |
| 11,056,199 B2 | 7/2021 | Papandreou et al. | |
| 11,152,079 B2* | 10/2021 | Bassa | G11C 29/785 |
| 11,475,962 B2 | 10/2022 | Nagashima | |
| 2013/0031443 A1 | 1/2013 | Oh et al. | |
| 2014/0063998 A1 | 3/2014 | Song | |
| 2015/0355845 A1 | 12/2015 | Lee et al. | |
| 2019/0198097 A1 | 6/2019 | Kim et al. | |
| 2019/0362796 A1 | 11/2019 | Choi et al. | |
| 2023/0298685 A1* | 9/2023 | Shimizu | G11C 8/08 |
| | | | 365/189.05 |

FOREIGN PATENT DOCUMENTS

| | | |
|---|---|---|
| KR | 20140030569 A | 3/2014 |
| KR | 20150140496 A | 12/2015 |
| KR | 101824068 B1 | 3/2018 |
| KR | 102070307 B1 | 1/2020 |
| KR | 102392056 B1 | 4/2022 |

* cited by examiner

SEMICONDUCTOR MEMORY DEVICES THAT SUPPORT ENHANCED DATA RECOVERY OPERATIONS

REFERENCE TO PRIORITY APPLICATION

This application claims priority to Korean Patent Application No. 10-2022-0106203, filed Aug. 24, 2022, the contents of which are hereby incorporated herein by reference.

BACKGROUND

(a) Field

The disclosure relates to integrated circuit devices and, more particularly, integrated circuit memory devices that support data recovery operations.

(b) Description of the Related Art

A memory device is a storage device that can write and read data when needed. A typical memory device may include a nonvolatile memory (NVM), in which stored data is retained even after power is removed from the device, and a volatile memory (VM), in which stored data is lost when power is removed.

In a memory device, various wires may be disposed to control a plurality of memory cells disposed therein. Examples of such wires include word lines and bit lines connected to the memory cells.

As the sizes of memory devices are gradually down-sized and the integration of memory cells therein is increased for greater storage, temporary or permanent degradation may occur.

SUMMARY

An embodiment of an inventive concept provides an integrated circuit memory device that can detect a memory block having a poor distribution of errors therein caused by memory cell wear-out, and can recover data of the memory block to thereby improve reliability, using an enhanced data recovery method.

A data recovery method according to an embodiment may include: (i) reading a first page containing a worn-out memory cell and a second page adjacent to the first page in a first memory block using a read voltage that exceeds a threshold voltage, (ii) determining a match rate of a position of a column including a "0" bit in the first page with a position of a column including a "0" bit in the second page, and (iii) reading the second page by adjusting a read pass voltage applied to a word line of another page when the match rate exceeds a predetermined rate. In some embodiments, the column containing the "0" bit may include data other than "0xFF" in the page. The predetermined rate may also be 90% or more, and a voltage value of the read voltage may be set to a predefined default value.

In addition, reading the second page by adjusting the read pass voltage applied to the word line of the other page may include adjusting the read pass voltage and applying the adjusted read pass voltage to a word line of the other page, and reading the second page by applying the read voltage to a word line of the second page. In addition, reading the second page by adjusting the read pass voltage applied to the word line of the other page may include: (i) obtaining a voltage value at which the number of "0" bits in the second page is less than a predetermined number, and (ii) reading the second page by setting the voltage value as the read pass voltage. In some embodiments, the predetermined number may be smaller than the number of bits that is correctable by using an error correction code (ECC).

According to further embodiment, operations to read the first page containing the worn-out memory cell and the second page adjacent to the first page may include: applying the read voltage to a word line of the first page and applying the read pass voltage to a word line of the second page to read the first page, then reading the second page by applying the read voltage to the word line of the second page, and then applying the read pass voltage to the word line of the first page. Operations to read the second page by adjusting the read pass voltage applied to the word line of the other page may include reading the second page while incrementally increasing the read pass voltage at predetermined intervals.

In addition, operations to read the first page containing the worn-out memory cell and the second page adjacent to the first page may include: determining whether the number of "0" bits in the first page exceeds a predetermined number, and then reading the second page when the number of "0" bits in the first page exceeds the predetermined number. This predetermined number may be smaller than the number of bits that is correctable using an ECC algorithm supported by the memory device.

In some embodiments, the data recovery method may further include: recovering data of the second page using an ECC, and writing the recovered data of the second page to a second memory block. The data recovery method may also include determining whether the first memory block is an uncorrectable ECC (UECC), and the operations to write the recovered data of the second page to the second memory block may include writing the recovered data of the second page to the second memory block when the first memory block is an UECC.

A semiconductor device according to another embodiment includes a memory device having a memory cell array therein, and a memory controller that controls operation of the memory device. This memory controller may: (i) read a first page containing a worn-out memory cell, and a second page adjacent to the first page in a first memory block of the memory cell array using a read voltage that exceeds a threshold voltage, (ii) determine a match rate of a position of a column including a "0" bit in the first page with a position of a column including a "0" bit in the second page, and (iii) read the second page by adjusting a read pass voltage applied to a word line of another page when the match rate exceeds a predetermined rate. The memory controller may also adjust the read pass voltage and apply the adjusted read pass voltage to a word line of the other page, and read the second page by applying the read voltage to a word line of the second page. Moreover, the memory controller may obtain a voltage value at which the number of "0" bits in the second page is smaller than a predetermined number, and read the second page by setting the voltage value as the read pass voltage. The memory controller may also determine whether the number of "0" bits in the first page exceeds a predetermined number, and read the second page when the number of "0" bits in the first page exceeds the predetermined number.

According to another embodiment, a data recovery method includes: reading a first page with a read voltage that exceeds a threshold voltage, then determining that the first page includes a worn-out memory cell when the number of "0xFF" data in the first page is less than a first predetermined number, and then reading the second page adjacent to the first page and recovering data. In some embodiments, data recovery operations may include: determining a pass voltage applied to a word line of a page other than the second page, and then reading data of the second page by applying the read voltage to a word line of the second page, and applying the worn-out pages voltage to a word line of the other page. In addition, operations to determine a pass voltage to be applied to the word line of the page other than the second page may include determining the pass voltage at which the number of "0xFF" data in the second page exceeds a second predetermined number when reading the second page while adjusting the pass voltage.

According to still further embodiments, a method of operating a memory device may include reading a first page of memory cells containing at least one worn-out memory cell therein using a read voltage, from a first memory block, and reading a second page of memory cells, which extends adjacent to the first page in the first memory block, using the read voltage. In addition, a match rate is determined between a position of a column including a "0" bit in the first page with a position of a column including a "0" bit in the second page, and then the second page is read by adjusting a read pass voltage applied to a word line of another page in the first memory block, when the match rate exceeds a threshold match rate.

BRIEF DESCRIPTION OF THE DRAWINGS

FIG. 10A shows a part of a data reading result of a page according to an embodiment.

FIG. 10B shows a part of a data reading result of a page according to an embodiment.

DETAILED DESCRIPTION OF THE EMBODIMENTS

Figure 1:
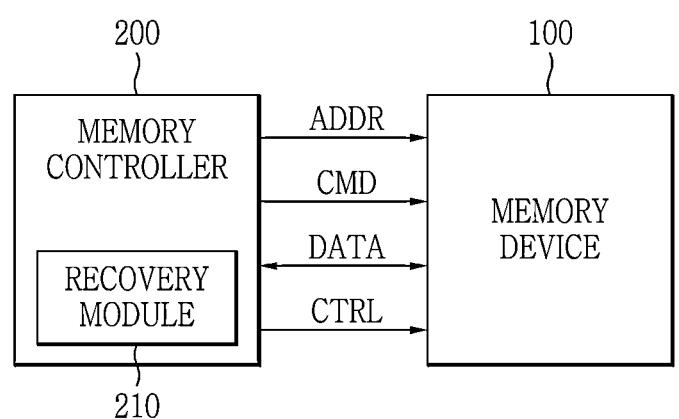
FIG. 1 is a schematic block diagram of a memory system according to an embodiment.

In the following detailed description, only certain embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowchart described with reference to drawing, the order of operations may be changed, several operations may be merged, some operations may be divided, and specific operations may not be performed.

In addition, expressions written in the singular may be construed as singular or plural unless explicit expressions such as "one" or "single" are used. Terms including ordinal numbers such as first, second, and the like may be used to describe various configurations elements, but constituent elements are not limited by these terms. These terms may be used for the purpose of distinguishing one constituent element from other constituent elements.

Figure 2:
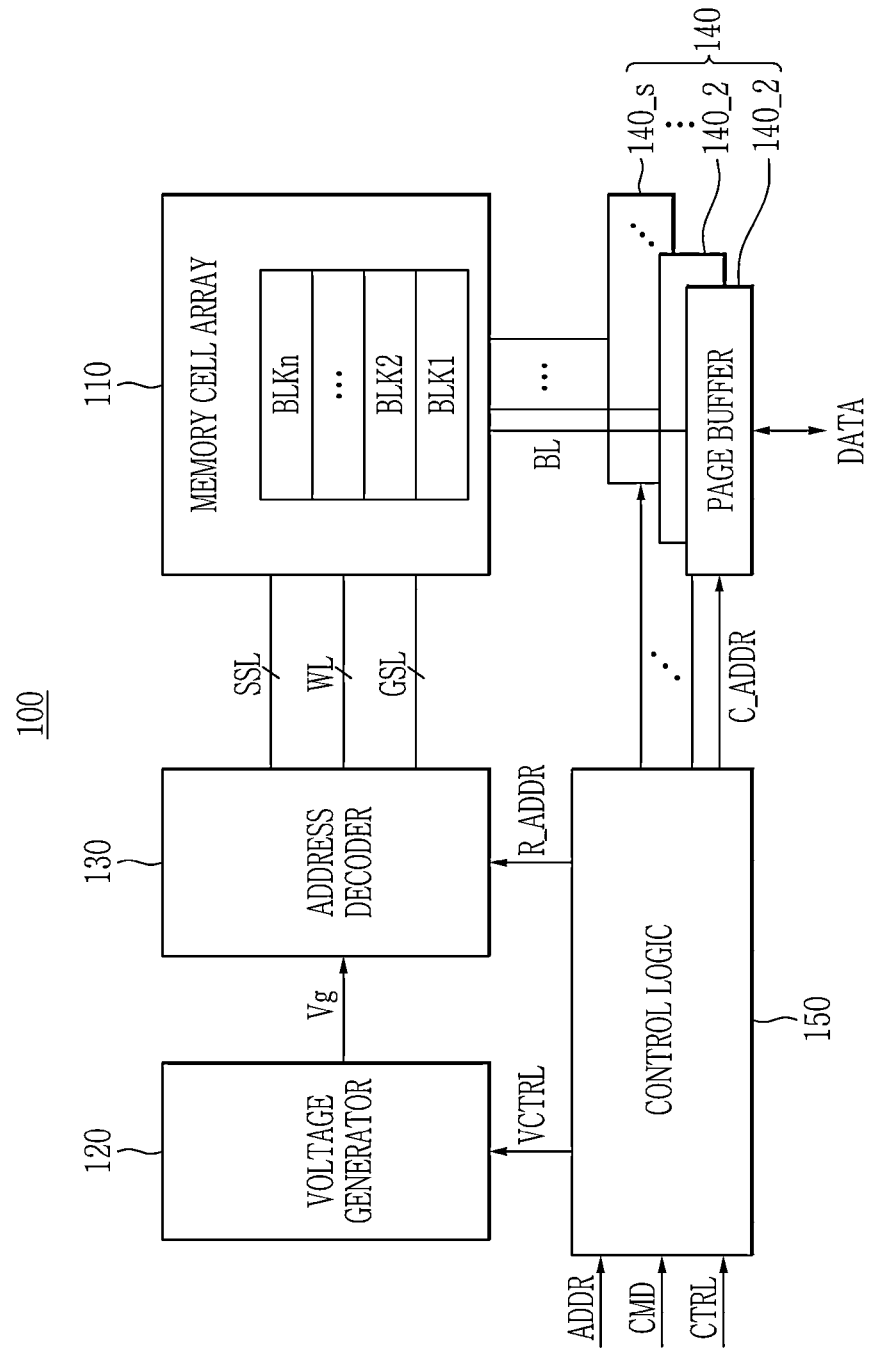
FIG. 2 is a schematic block diagram provided for description of the memory device shown in FIG. 1.

FIG. 1 is a schematic block diagram of a memory system according to an embodiment, and FIG. 2 is a schematic block diagram provided for description of the memory device shown in FIG. 1. Referring to FIG. 1 and FIG. 2, a memory system 10 may communicate with a host through various interfaces. The host may request a data processing operation of the memory system 10, for example, a data read operation, a data write (program)) operation, and a data erase operation. For example, the host may be a central processing unit (CPU), a graphic processing unit (GPU), a microprocessor, or an application processor (AP).

The memory system 10 may be included in a storage device. For example, the storage device may be implemented in various types such as a solid-state drive (SSD), an embedded multi-media card (eMMC), a universal flash storage (UFS), a compact flash (CF), a secure digital (SD), a micro secure digital (Micro-SD), a mini-SD, an extreme digital (xD), or a memory stick.

The memory system 10 may include a memory device 100 and a memory controller 200. The memory controller 200 may be configured to access the memory device 100 in response to a request from the host. The memory controller 200 may be configured to provide an interface between the memory device 100 and a host. In addition, the memory controller 200 may be formed to drive firmware for controlling the memory device 100.

The memory controller 200 may control the operation of the memory device 100. Specifically, the memory controller 200 may provide at least one of an address ADDR, a command CMD, data DATA, and a control signal CTRL along an input and output line connected to the memory device 100. The memory controller 200 may write data to the memory device 100, erase data from the memory device 100, or read data from the memory device 100 by using at least one of the address ADDR, the command CMD, and the control signal CTRL. The control signal CTRL may include chip enable CE, write enable WE, read enable RE, and the like.

The memory controller 200 may include a recovery module 210 for recovering data when a memory cell included in a page of the memory device 100 is worn out. The recovery module 210 can detect pages with poor distribution due to wearing out. For example, when reading data of a page using a read voltage, the recovery module 210 may determine whether the number of columns including '0' bits exceeds a predetermined number of bits. When the number of columns including '0' bits in a specific page exceeds a predetermined number of bits, the recovery module 210 may determine the corresponding page as a worn-out page.

The recovery module 210 reads a page adjacent to the worn-out page, and may determine whether a rate that a position of the column containing the '0' bit in the adjacent page matches the position of the column containing the "0" bit in the worn-out page exceeds a certain percentage. When the match rate exceeds the certain percentage, the recovery module 210 may check the number of bits to be corrected while adjusting the read voltage. In this case, the recovery module 210 may determine the smallest value among voltage values in which the number of bits to be corrected is included in a correction capability range of the memory controller 200 as the read voltage. Thereafter, the memory controller 200 may recover the data of the memory device 100 by using the read voltage determined by the recovery module 210.

The memory device 100 may be a non-volatile memory device such as a NAND flash memory, a vertical NAND (VNAND) flash memory, a bonding vertical NAND (BVNAND) flash memory, a NOR flash memory, a resistive random access memory (RRAM), a phase-change RAM (PRAM), a magneto resistive RAM (MRAM), a ferroelectric RAM (FRAM), a spin-implant spin transfer torque RAM (STT-RAM), and a conductive bridging RAM (CBRAM).

The memory device 100 may include a memory cell array 110, a voltage generator 120, an address decoder 130, a page buffer 140, and a control logic 150. The memory cell array 110 may include a plurality of memory blocks BLK1 to BLKn. The plurality of memory blocks BLK1 to BLKn each may be connected to the address decoder 130 through a word line WL, a string select line SSL, and a ground select line GSL, and may be connected to a page buffer 140 through a bit line BL.

The memory cell array 110 may include a plurality of memory cells disposed in regions where the plurality of word lines WL and the plurality of bit lines BL intersect. Each memory cell may be used as a cell type such as a single level cell SLC, a multi-level cell MLC, a triple level cell TLC, or a quad level cell QLC. The memory cell array 110 may include a non-volatile memory cell. For example, the memory cell array 110 may include a 2D NAND memory array or a 3D vertical (VNAND) memory array.

The voltage generator 120 receives power, regulates a voltage signal Vg for memory operation based on a voltage control signal VCTRL, and provides the voltage signal Vg to the memory cell array 110 through the address decoder 130. The address decoder 130 may be connected to the memory cell array 110 through the word line WL, the string select line SSL, and the ground select line GSL. The address decoder 130 may decode a row address R-ADDR to select at least one of the plurality of memory blocks BLK1 to BLKn. That is, the row decoder 130 may select the word line WL, the string select line SSL, and the ground select line GSL by using the row address R-ADDR. The address decoder 130 may provide the voltage signal Vg supplied from the voltage generator 120 to the word line WL.

The page buffer 140 may include a first to s-th page buffers 140_1 to 140_s. The first to s-th page buffers 140_1 to 140_s may be respectively connected to the plurality of memory cells through the plurality of bit lines BL (here, s is an integer greater than or equal to 3). The page buffer 140 may select at least one bit line from among the plurality of bit lines BL based on the column address C_ADDR. The page buffer 140 may operate as a write driver or a sense amplifier depending on the operation mode. For example, during a program operation, the page buffer 140 may receive data DATA from the memory controller 200 and may apply a bit line voltage corresponding to the data DATA to a selected bit line. During a read operation, the page buffer 140 may sense a current or a voltage of the selected bit line, sense the data DATA stored in the memory cell array 110, and provide it to the memory controller 200.

The control logic 150 may provide each control signal related to the memory operation to the voltage generator 120, the address decoder 130, and the page buffer 140. The control logic 150 may control the overall operation of the memory device 100. The control logic 150 may control the memory device 100 using an internal control signal based on at least one of the address ADDR, the command CMD, and the control signal CTRL received from the memory controller 200. For example, the control logic 150 may generate the voltage control signal VCTRL for controlling the voltage generator 120 or may generate the row address R-ADDR and the column address C_ADDR based on the address ADDR. The control logic 150 may output the row address R-ADDR to the address decoder 130, or the column address C_ADDR to the page buffer 140.

Figure 3:
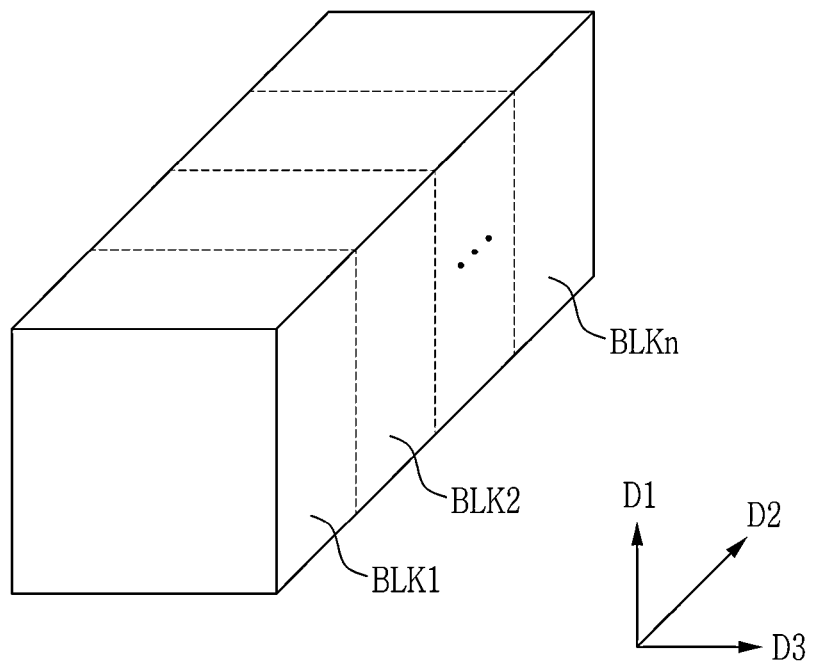
FIG. 3 is a schematic drawing for description of the memory cell array illustrated in FIG. 2.
Figure 4:
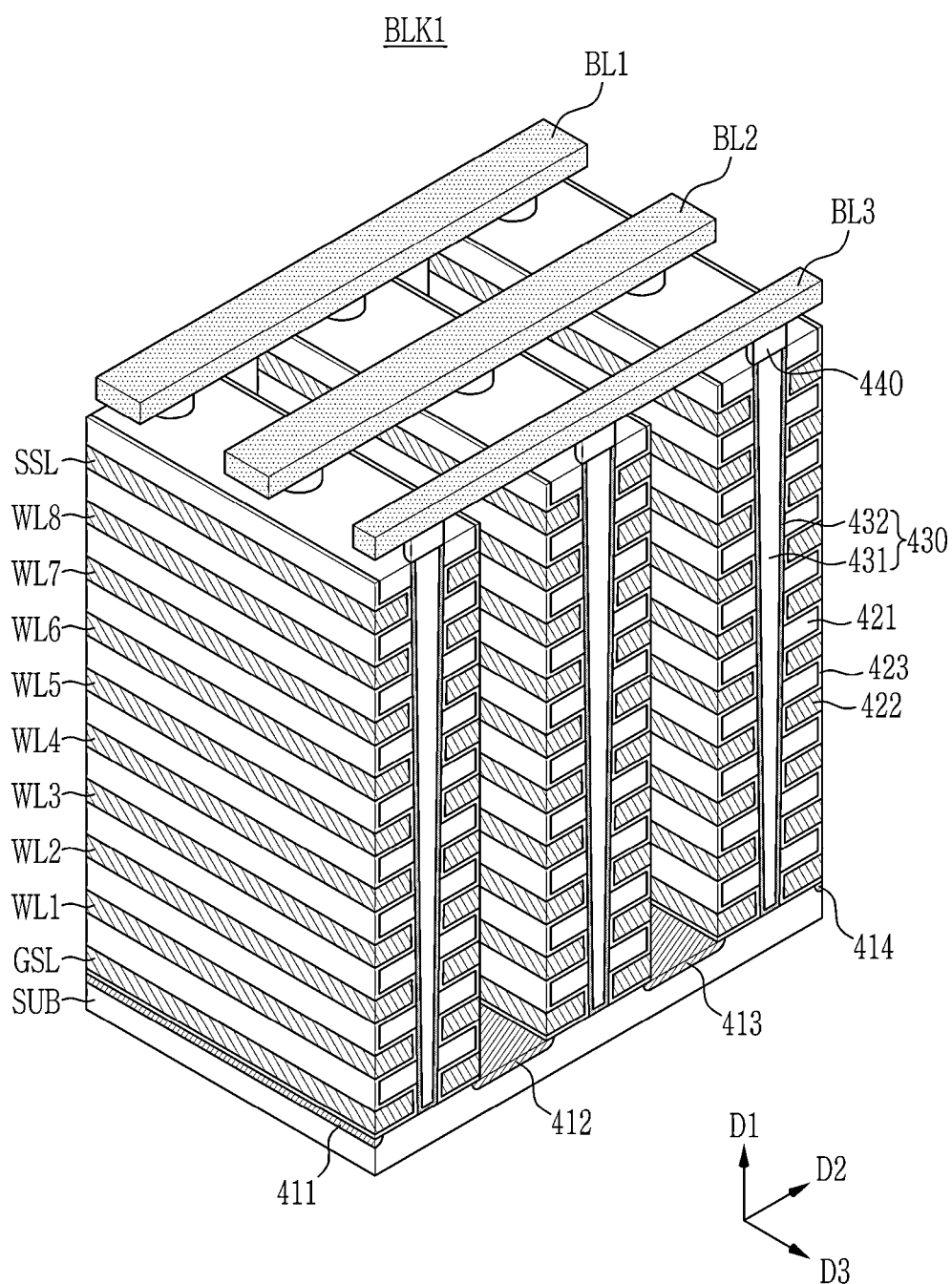
FIG. 4 is a perspective cross-sectional view for explaining one memory block of a memory cell array.
Figure 5:
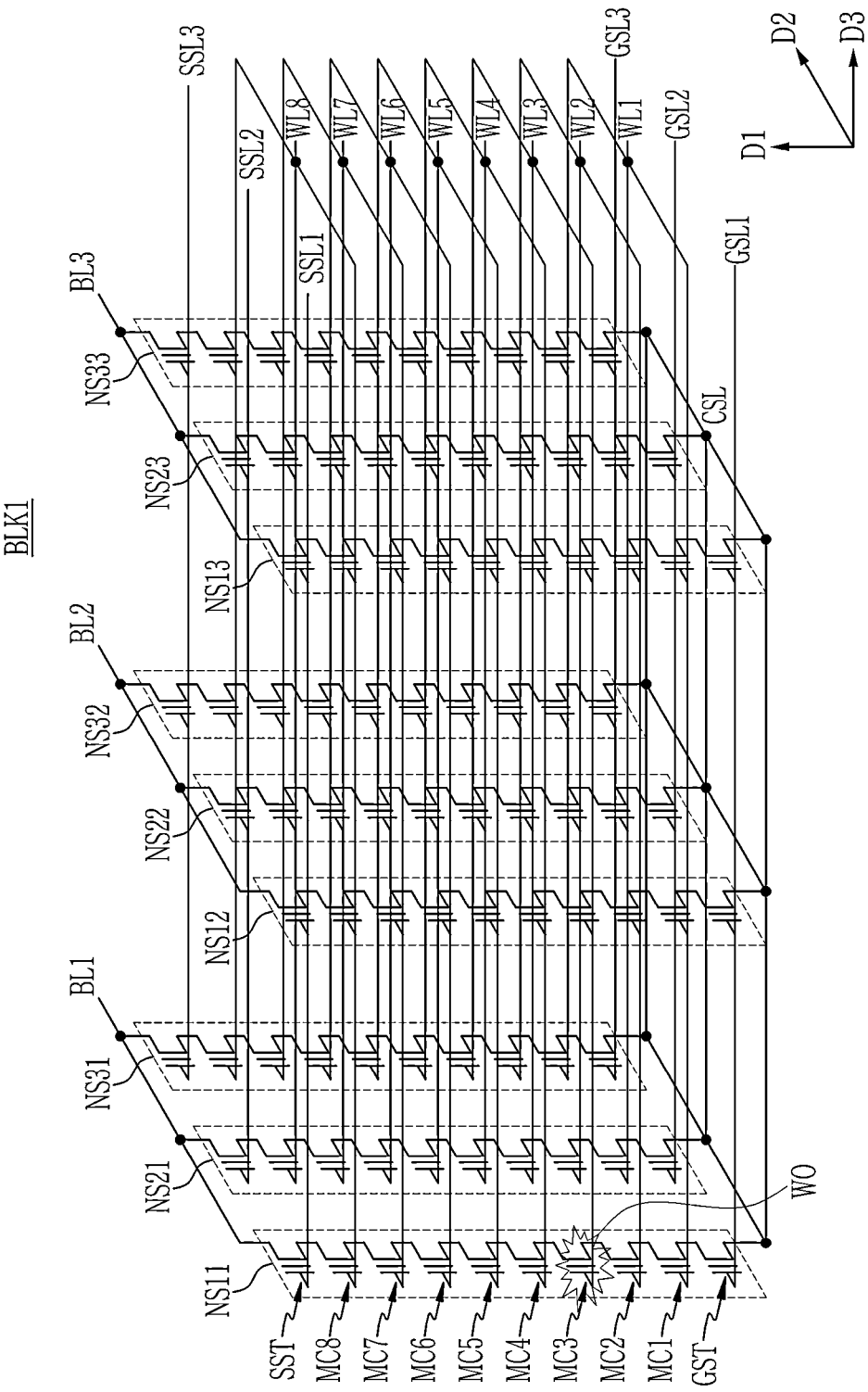
FIG. 5 is an electrical equivalent circuit diagram of the memory block of FIG. 4.

FIG. 3 is a schematic drawing for description of the memory cell array illustrated in FIG. 2, FIG. 4 is a perspective cross-sectional view for explaining one memory block of a memory cell array, FIG. 5 is an electrical equivalent circuit diagram of the memory block of FIG. 4, and FIG. 6 to FIG. 7B show the distributions of threshold voltages in memory cells according to the embodiment.

Referring to FIG. 3 to FIG. 5, each of the plurality of memory blocks BLK1 to BLKn may be formed in a three-dimensional structure on a substrate SUB. For example, a plurality of memory NAND strings included in each of the plurality of memory blocks BLK1 to BLKn may be formed in a direction D1 that is perpendicular to the substrate. A top surface of the substrate may be perpendicular to a direction D2 and a direction D3.

The memory block BLK1 may be formed in a direction perpendicular to the substrate SUB. The substrate SUB may be p-type silicon. The substrate SUB may include n-type doping regions 411 to 414 doped differently than the substrate SUB. Alternatively, the substrate SUB may be implemented as n-type silicon, and the doping regions 411 to 414 may be p-type. The doping regions 411 to 414 may represent common source regions CSR. The plurality of common source regions CSR may be connected in common to form a common source line CSL.

An insulating material 421 and a gate electrode 422 may be alternately laminated on the substrate SUB. A data storage layer 423 may be formed between the insulating material 421 and the gate electrode 422. A pillar 430 may penetrate the insulating material 421 and the gate electrode 422 in a vertical direction. The pillar 430 may be connected to the substrate SUB through the insulating material 421 and the gate electrode 422. The pillar 430 may be formed in a V-shape. That is, the pillar 430 may become narrower as it approaches the substrate SUB while passing through the insulating material 421 and the gate electrode 422. The pillar 430 may include an inside 431 formed of an insulating material such as a silicon oxide and an outside 432 formed of a channel semiconductor. In terms of semiconductor process characteristics, when a direction from the substrate SUB to the bit line is defined as upward, a channel width may be relatively increased as it is positioned at the upper portion. That is, the outside 432 operating as a channel may have a V-shape. The gate electrode 422 of the memory block BLK1 may be connected to a ground select line GSL1, word lines WL1 to WL8, or a string select line SSL1. In addition, the pillar 430 may be connected to bit lines BL1 to BL3 through the drain 440.

Referring to FIG. 5, the first memory block BLK1 may include a plurality of memory NAND strings NS11 to NS33 connected between the plurality of bit lines BL1 to BL3 and the common source line CSL. Each of the plurality of memory NAND strings NS11 to NS33 may include a string select transistor SST, a plurality of memory cells MC1 to MC8, and a ground select transistor GST.

A gate of the string select transistor SST may be connected to the corresponding string select lines SSL1 to SSL3. A plurality of memory cells MC1 to MC8 may be connected to corresponding word lines WL1 to WL8, respectively. The word lines WL1 to WL8 may correspond to gate lines. A gate of the ground select transistor GST may be connected to the corresponding ground select lines GSL1 to GSL3. The string select transistor SST may be connected to the corresponding bit lines BL1 to BL3, and the ground select transistor GST may be connected to the common source line CSL.

In the first memory block BLK1, a word line (e.g., WL1) of the same height may be commonly connected, and the ground select lines GSL1 to GSL3 and the string select lines SSL1 to SSL3 may be separated from each other. In this case, temporary or non-temporary wear-out WO may have occurred in the first memory block BLK1. For example, wear-out WO occurs when the program-to-program time in the memory cell is fast, when the program voltage of the memory cell is high compared to the degradation level, when the program voltage is high due to the loss of the erase count (EC), when the program/erase cycle (P/E cycle) is high, and when an abnormal voltage is predetermined due to voltage instability.

Figure 6:
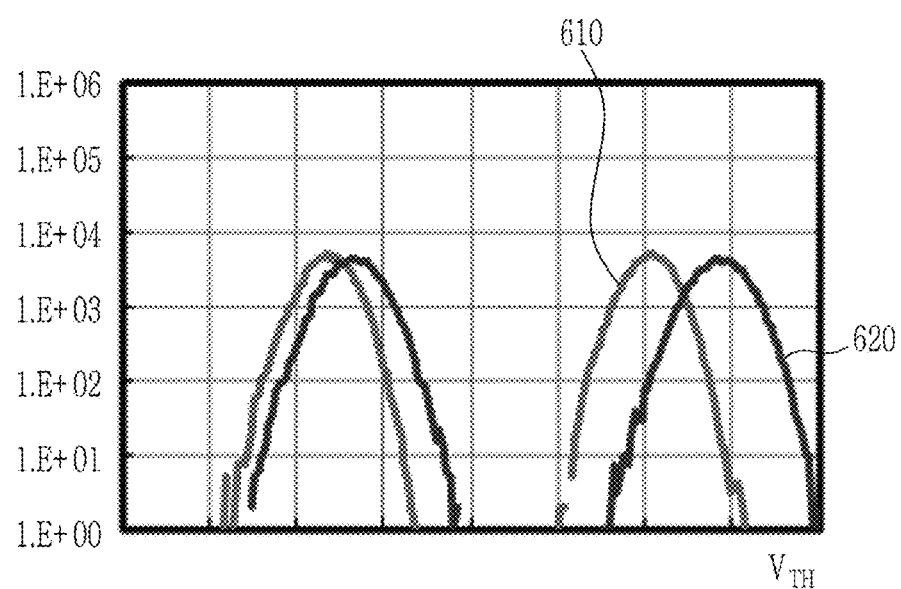
FIG. 6 shows a distribution of memory cells according to an embodiment.

In FIG. 5, it is illustrated that wear-out WO occurred in the third memory cell MC3 of the third word line WL3. The distribution of third memory cell MC3 may be as shown in FIG. 6. That is, as shown in FIG. 6, the wear-out WO shifts the distribution of the third memory cell MC3 rightward from 610 to 620 such that $V_{TH}$ is formed higher than an expected value. That is, the wear-out WO may make it difficult to read data of the third memory cell MC3.

Figure 7A:
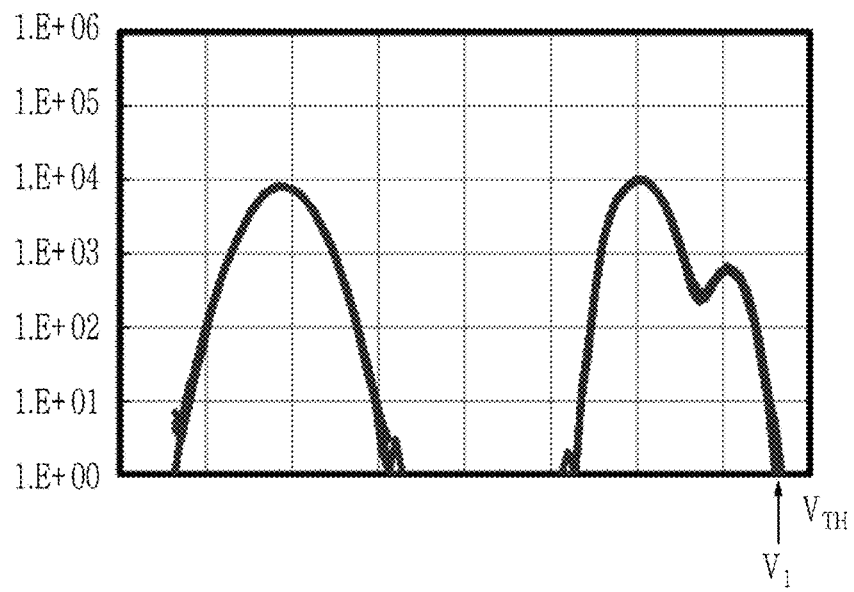
FIG. 7A shows a distribution of memory cells according to an embodiment.
Figure 7B:
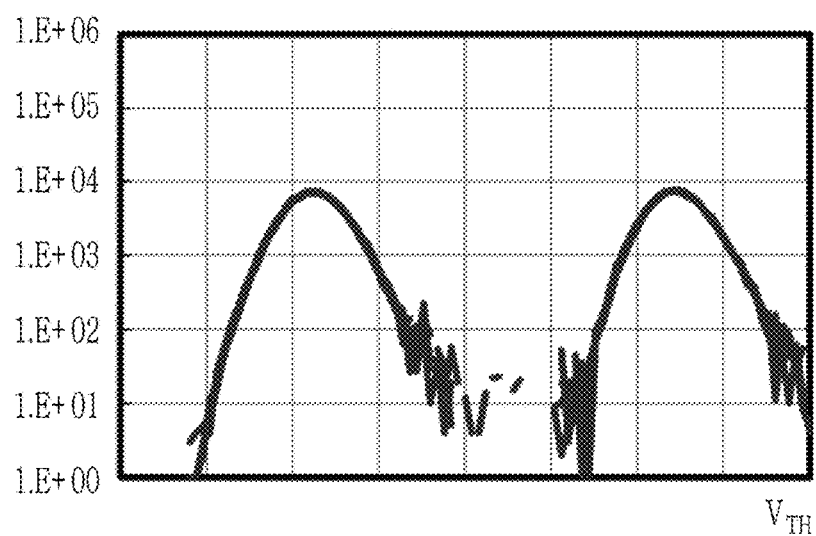
FIG. 7B shows a distribution of memory cells according to an embodiment.

In this case, the wear-out WO of the third memory cell MC3 may affect other memory cells of the first NAND string NS11 to which the third memory cell MC3 is included. For example, a level programmed in the fifth memory cell MC5 of the first NAND string NS11 may be as shown in FIG. 7A, but the distribution of the fifth memory cell MC5 may be as shown in FIG. 7B due to the wear-out WO of the third word line WL3. That is, it may be difficult to read data from other memory cells (e.g., fifth memory cell MC5) due to the wear-out WO of the third memory cell MC3.

The memory controller 200 may detect that wear-out WO has occurred in the third memory cell MC3, and may detect other memory cells affected by the wear-out WO of the third memory cell MC3. The memory controller 200 may detect another memory cell (or cells) affected by the wear-out WO of the third memory cell MC3 by using a read voltage $V_{read}$ and a read pass voltage $V_{RDPS}$. Here, the read voltage $V_{read}$ may be a voltage applied to a read target word line, and the read pass voltage $V_{RDPS}$ may be a voltage applied to a word line other than the read target word line. After detecting the memory cell affected by the wear-out WO, the memory controller 200 may read data of the memory cell affected by the wear-out WO by adjusting the read pass voltage $V_{RDPS}$. The memory controller 200 may perform recovery by writing the read data to another memory cell.

In FIG. 4 and FIG. 5, it is illustrated that a plurality of bit lines BL1 to BL3 are three, a plurality of memory NAND strings NS11 to NS33 are nine, and each of the memory NAND strings NS11 to NS33 may include eight memory cells MC1 to MC8 respectively connected to eight word lines WL1 to WL8, but is not necessarily limited thereto, and may be implemented in different numbers according to an embodiment.

Figure 8:
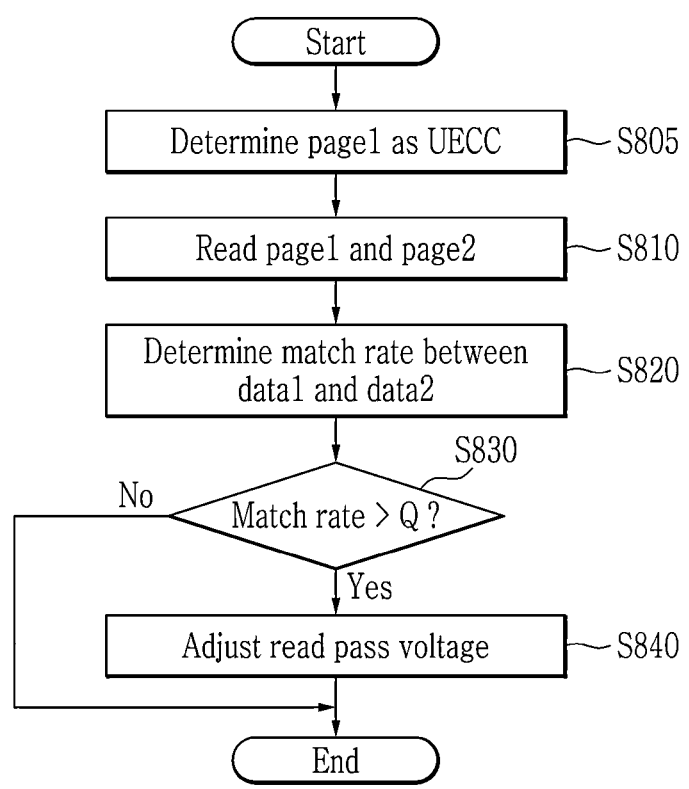
FIG. 8 shows a flowchart of a data recovery method according to an embodiment.

FIG. 8 shows a flowchart of a data recovery method according to an embodiment. Referring to FIG. 8, the memory controller 200 may determine that a first page in the first memory block includes uncorrectable error correction code (UECC) data (S805). For example, when the first memory block is an SLC cell type, the memory controller 200 may read the data of the first page by applying a voltage between the erase distribution and the program distribution. The memory controller 200 may input the data of the read first page to an ECC engine. When the read data of the first page exceeds the correction capability of the ECC engine, the memory controller 200 may determine that the data of the first page cannot be corrected.

In this specification, it has been described that the first memory block is of the SLC cell type for convenience of explanation, but is not necessarily limited thereto, and may be equally applied to cell types such as MLC, TLC, and QLC.

The memory controller 200 may read the first page and a second page (S810). In this case, the memory controller 200 may apply a read voltage exceeding a threshold voltage of a normal memory cell. For example, the memory controller 200 reads first data of the first page by applying a read voltage to a word line of the first page and applying a read pass voltage to word lines of pages other than the first page (including the second page). In this case, the read pass voltage may be a default value. The first page may contain worn-out memory cells, and the second page may be adjacent to the first page. The first page and the second page may be pages of the first memory block. The memory controller 200 also applies the read voltage to a word line of the second page, and applies the read pass voltage to word lines of pages other than the second page (including the first page) in the first memory block to read second data of the second page.

In the embodiment, the memory controller 200 determines whether the number of '0' bits in the first data of the first page exceeds P, and when the number of '0' bits in the first data exceeds P, the memory controller 200 may determine that the first page includes the UECC data. Here, P is a predetermined number and may be smaller than the number of bits that can be corrected using an error correction code ECC. In an embodiment, the memory controller 200 may determine whether the number of '0' bits in the first data exceeds P bit. When the number of '0' bits in the first data exceeds P, the memory controller 200 may determine that the first page includes a worn-out memory cell and that UECC data is generated due to wear-out.

The memory controller 200 may determine a matching rate between the first page and the second page (S820). For example, the memory controller 200 may determine the matching rate between a position of a column including the "0" bit in the first page and a position of a column including the "0" bit in the second page. The column including a "0" bit may be a column including data other than "0xFF" in the page. For example, a column including "0" bit may include data such as "0xFB", "0xFD", and "0x7E".

The memory controller 200 may determine whether the match rate exceeds Q % (S830). Here, Q may be greater than or equal to 90. When the match rate exceeds Q %, the memory controller 200 may read the second page by adjusting the read pass voltage applied to the word lines of other pages (S840). The memory controller 200 may read the second page while applying the read voltage to the word line of the second page and adjusting the read pass voltage applied to the other word lines. The memory controller 200 may incrementally increase the read pass voltage at a predetermined interval. The predetermined interval may be 0.25 V, 0.5 V, 1 V, or the like.

For example, the memory controller 200 may obtain a voltage value in which the number of "0" bits in the second page becomes smaller than R bits when adjusting the read pass voltage. The memory controller 200 applies the read pass voltage to the word lines of other pages with the obtained voltage value, and applies the read voltage to the second page to read third data. Here, R is a predetermined number and may be smaller than the number of bits that can be corrected using ECC. In the embodiment, R may be the same as P described above.

The memory controller 200 may recover the third data and write the recovered third data to the second memory block. The second memory block may be a normal memory block that has not been worn out. In an embodiment, the memory controller 200 may determine whether the first memory block is an UECC. The memory controller 200 may write the third data to the second memory block when the first memory block is a UECC block.

Figure 9:
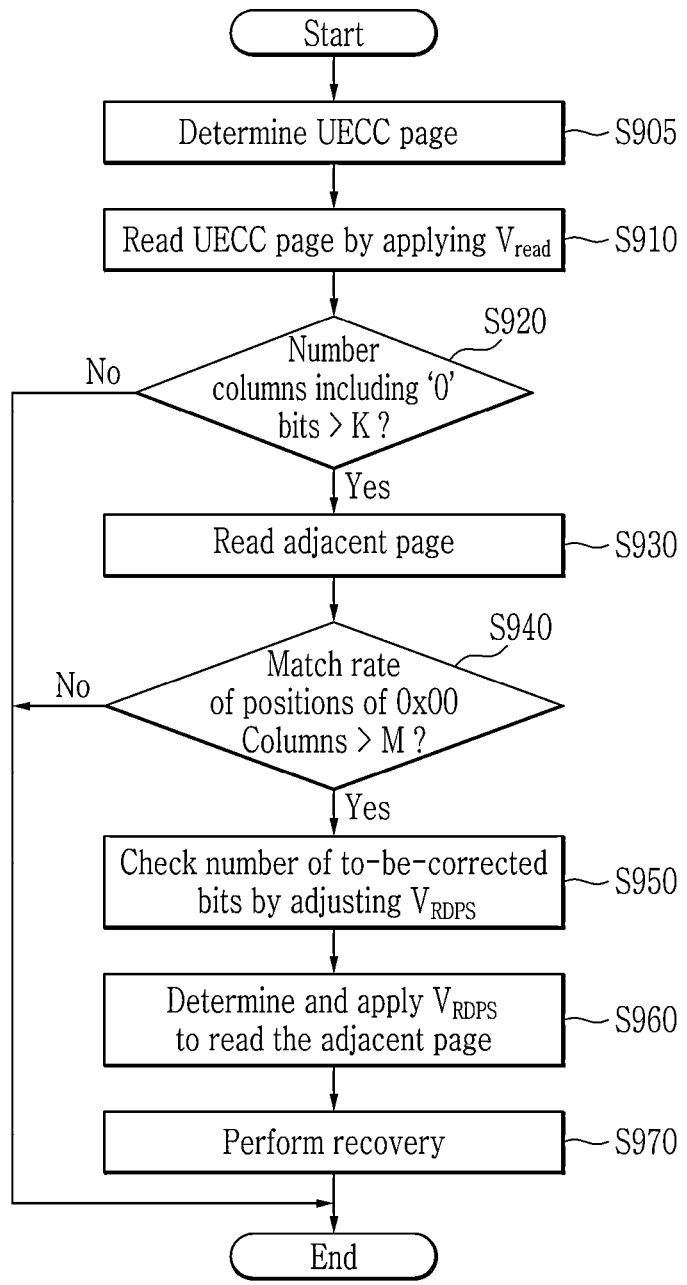
FIG. 9 shows a flowchart of a data recovery method according to an embodiment.
Figure 10A:
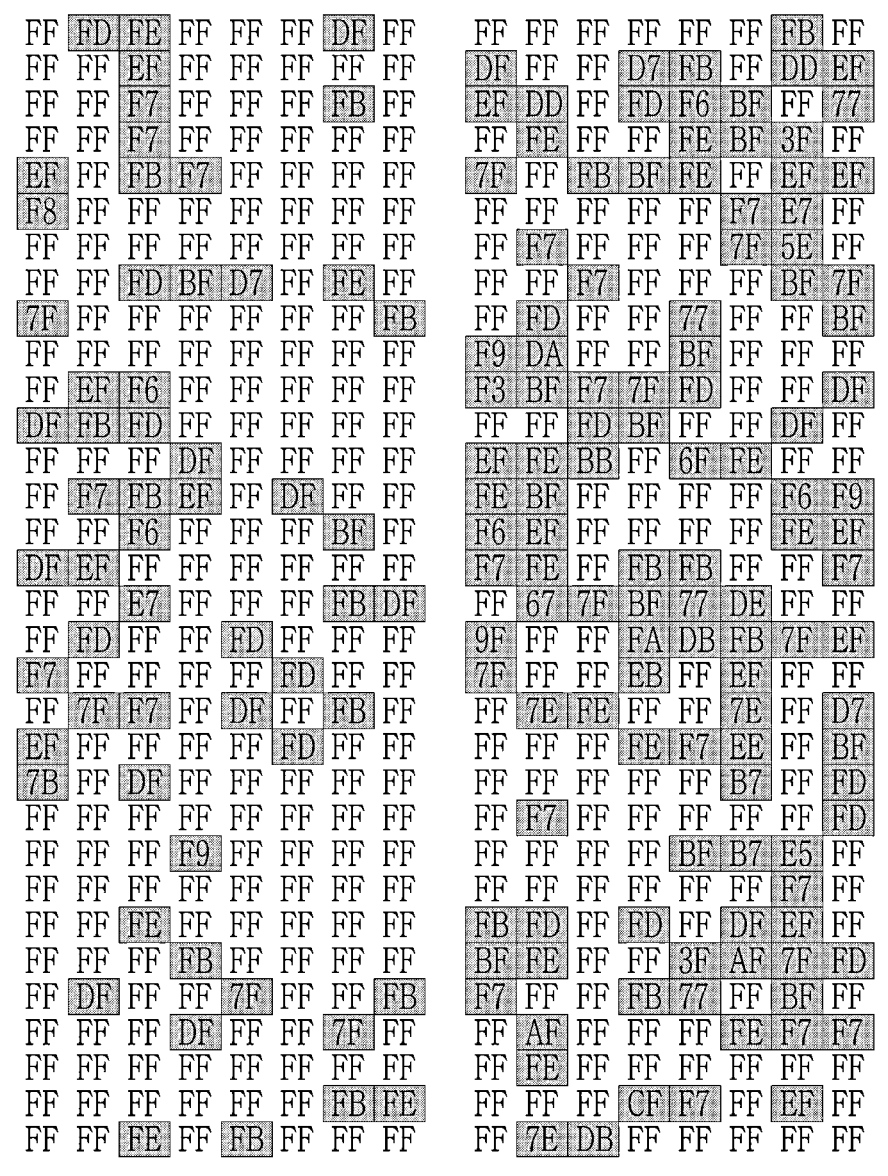
Figure 10B:
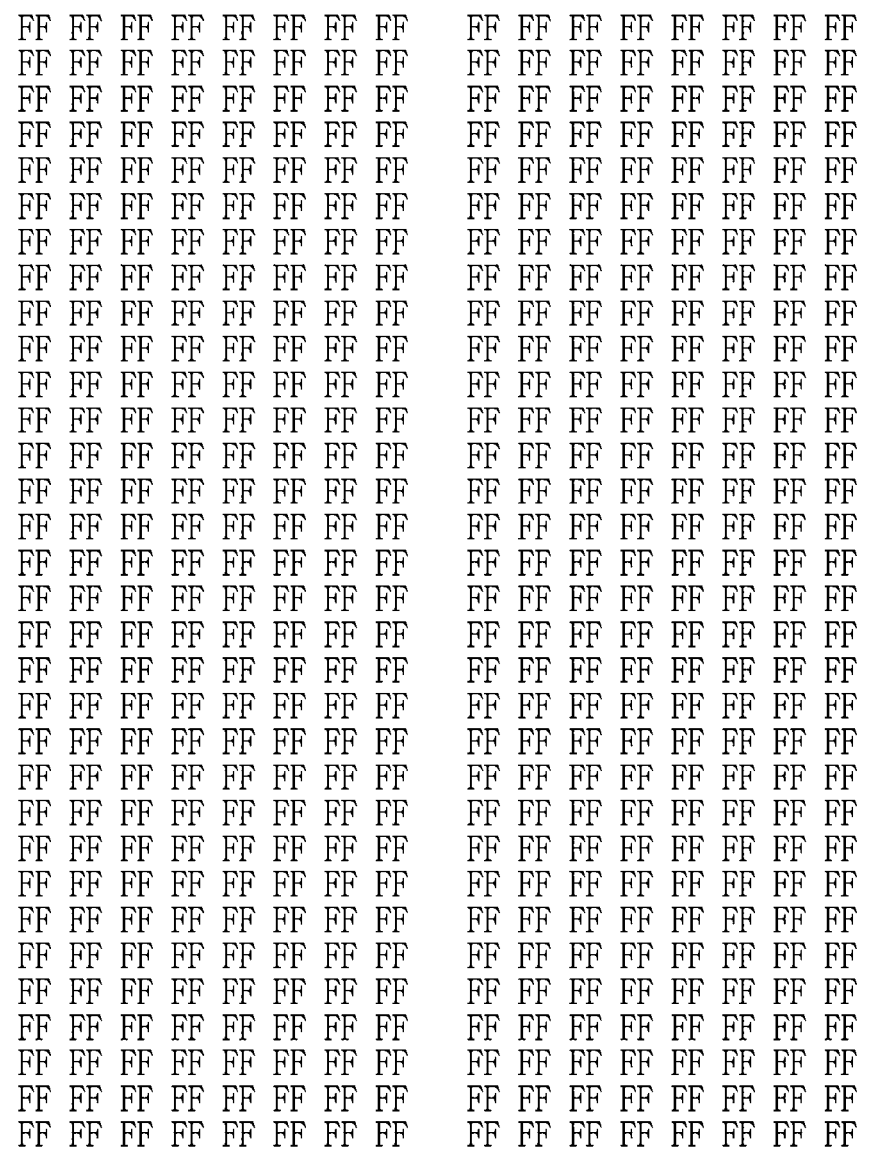
Figure 11:
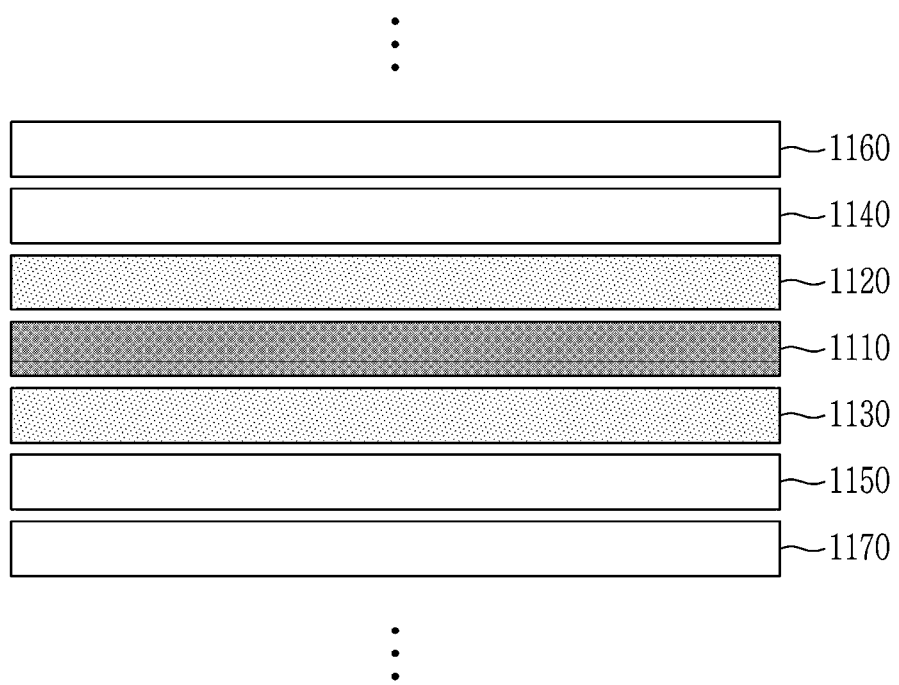
FIG. 11 schematically shows a plurality of pages according to the embodiment.

FIG. 9 shows a flowchart of a data recovery method according to an embodiment, FIG. 10A and FIG. 10B represent a part of a data reading result of a page according to the embodiment, and FIG. 11 schematically shows a plurality of pages according to the embodiment.

Referring to FIG. 9, a memory controller 200 may determine an UECC page in a first memory block (S905). For example, when the memory controller 200 reads pages from the first memory block, a page whose read data exceeds correction capability of an ECC engine may be determined as a UECC page.

The memory controller 200 may read data of the UECC page by applying a read voltage $V_{read}$ (S910). The read voltage $V_{read}$ may be determined as a value greater than $V_{TH}$ positioned at the top in the distribution of a normal word line. For example, assuming that there is a distribution of the normal word line like FIG. 7A, the $V_{TH}$ positioned at the top may be V1, which may be 4.9 volts (V). Accordingly, the memory controller 200 may apply 5 V as a read voltage $V_{read}$.

The memory controller 200 may read a memory block of the memory device 100 as a page unit. That is, the memory controller 200 may read data of a plurality of memory cells connected to one word line in the memory block. The memory controller 200 may read page data in the same mode as SLC, MLC, TLC, and QLC. For example, a part of the result of reading the data of the page by the memory controller 200 is shown in FIG. 10A or FIG. 10B.

The memory controller 200 may determine whether the number of columns including "0" bits in the UECC page exceeds K bits (S920). A column including "0" bit may be a column including data other than "0xFF" in the page. For example, a column including a "0" bit may include data such as "0xFB", "0xFD", and "0x7E". K may be determined based on the ability of the memory controller 200 to correct. For example, when the memory controller 200 can correct 200 bits per 4 kilobytes (kB) of data, the memory controller 200 may determine K to be a number of 200 or more. That is, when reading the UECC page with a read voltage $V_{read}$ greater than $V_{TH}$, the memory controller 200 may determine whether the read data is correctable.

Referring to FIG. 10A, the read page may include a column with a value of FF and a column with a value other than FF (e.g., FD, FE, DF, EF, and the like), and in this specification, a column with a value other than FF (i.e., a column including a "0" bit) will be referred to as a non-FF column (shaded portion). The memory device 200 may determine whether the number of non-FF columns exceeds K. The memory device 200 may determine that a page in which the number of non-FF columns exceeds K is a worn-out UECC page. In contrast, referring to FIG. 10B, the read page may include only an FF column. The page of FIG. 10B may not be worn out or may not be affected by wear-out. The memory controller 200 may terminate a recovery procedure when the number of non-FF columns in the UECC page does not exceed K.

When the number of non-FF columns in the UECC page exceeds K, the memory controller 200 may read data of an adjacent page (S930). That is, the memory controller 200 may read the data of the adjacent page of the worn-out UECC page. The memory controller 200 may read data of an adjacent page by applying a read voltage $V_{read}$ to the word line of the adjacent page. In this case, a read pass voltage $V_{RDPS}$ may be applied to word lines corresponding to pages other than the adjacent page. Adjacent pages may mean T pages of an upper direction and/or T pages of a lower direction of worn-out UECC pages (T is an integer greater than or equal to 1). T may be predetermined by the memory controller 200.

Referring to FIG. 11, the memory block may include a plurality of pages 1110 to 1170. The memory controller 200 reads data of a page 1110 and determines that the number of non-FF columns in the page 1110 exceeds K. That is, the page 1110 may be a UECC page due to cell wear-out. When T is 1, the memory controller 200 may read data of at least one of pages 1120 and 1130. However, when T is 2, the memory controller 200 may read data of pages 1120 and 1140. Alternatively, the memory controller 200 may read data of pages 1130 and 1150. Alternatively, the memory controller 200 may read data of pages 1120 to 1150. And, when T is 3, the memory controller 200 may read data of pages 1120, 1140, and 1160. Alternatively, the memory controller 200 may read data of pages 1130, 1150, and 1170. Alternatively, the memory controller 200 may read data of pages 1120 to 1170.

The memory controller 200 may determine whether the match rate between a position of a non-FF column in the worn-out UECC page and a position of a non-FF column in an adjacent page is greater than M % (S940). M is a value that can be used as a criterion for determining the match rate, and may be a number indicating a high correlation. M may be determined as 90, 95, 97, and the like depending on embodiments. For example, as the M value is set to a larger value, the match rate can be strictly determined. When wear-out occurs in a specific memory cell, the NAND string in which the memory cell is positioned is affected, and thus when multiple pages of data are read, the position of the non-FF column may be the same corresponding to the NAND string. For example, as a result of reading data from the page adjacent to the page of FIG. 10A, it can be determined whether the matching rate of the position of the non-FF column in the memory controller 200 with the position of the shaded part in FIG. 10A exceeds M %.

The memory controller 200 may terminate the recovery procedure when the match rate is less than or equal to M %. However, when the match rate exceeds M %, the memory controller 200 may check the number of bits to be corrected in the adjacent page by adjusting the read pass voltage $V_{RDPS}$ (S950). The memory controller 200 may correct a bit to be corrected using an ECC. For example, when the unit of one page is 16 kB, the unit corrected using the ECC may be 4 kB.

When the memory controller 200 adjusts the read pass voltage $V_{RDPS}$, the number of bits to be corrected may be as shown in Table 1. The number of bits to be corrected may indicate the number of bits per unit (e.g., 4 kB) corrected using the ECC. The memory controller 200 may check the number of bits to be corrected while changing the read pass voltage $V_{RDPS}$ from $V_A$ to $V_E$. In this case, the read voltage $V_{read}$ is a default value, and the default value may not change. The memory controller 200 may increase the read pass voltage $V_{RDPS}$ at a predetermined interval. For example, $V_A$ may be 5 V, $V_B$ may be 5.5 V, $V_C$ may be 6 V, $V_D$ may be 6.5 V, $V_E$ may be 7 V, and the predetermined interval may be 0.5 V. However, without being limited thereto, various values may be used like $V_A$ may be 6 V, $V_B$ may be 6.25 V, $V_C$ may be 6.5 V, $V_D$ may be 6.75 V, $V_E$ may be 7 V, and the predetermined interval may be 0.25 V. Alternatively, the memory controller 200 may check the number of bits to be corrected while linearly increasing the read pass voltage $V_{RDPS}$.

TABLE 1

| $V_{RDPS}$ (V) | $V_A$ | $V_B$ | $V_C$ | $V_D$ | $V_E$ |
|---|---|---|---|---|---|
| To-be-Corrected bits (bit) | UECC | UECC | 448 | 9 | 0 |

Referring to Table 1, when $V_A$ or $V_B$ is applied as the read pass voltage $V_{RDPS}$, the error bit correction of the memory controller 200 may fail because the error bit is excessive enough to exceed the correction capability of the memory controller 200. This may be expressed as an uncorrectable ECC (UECC). When $V_C$ is applied as the read pass voltage $V_{RDPS}$, the memory controller 200 may confirm that the bits to be corrected are 448 bits. The correction target bit of 448 bits may be a value exceeding the correction capability of the memory controller 200, and in this case, it may correspond to the UECC. Accordingly, the memory controller 200 may apply $V_D$ as the read pass voltage $V_{RDPS}$ and confirm that the number of bits to be corrected is 9. The memory controller 200 applies $V_E$ as the read pass voltage $V_{RDPS}$, and may confirm that the number of bits to be corrected is 0.

In order to read data of an adjacent page, the memory controller 200 may determine a read pass voltage $V_{RDPS}$, and apply the determined read pass voltage $V_{RDPS}$ to word lines corresponding to pages other than the adjacent page (S960). The memory controller 200 may apply a read voltage $V_{read}$ to a word line of an adjacent page. The memory controller 200 may determine the smallest value among the voltage values in which the number of bits to be corrected is included the correction capability range of the memory controller 200 as the read pass voltage $V_{RDPS}$.

Referring to Table 1, when the correction capability of the memory controller 200 is 200 bits per 4 kB, the number of bits to be corrected may be included within the correction capability range of the memory controller 200 when $V_D$ and $V_E$ are applied as the read pass voltage $V_{RDPS}$. Accordingly, the memory controller 200 may determine the smaller of the two values, which is $V_D$, as the read pass voltage $V_{RDPS}$.

The memory controller 200 may apply the read voltage $V_{read}$ to a word line corresponding to a read target page (a page adjacent to a worn-out page) and may read data of the read target page by applying the read pass voltage $V_{RDPS}$ to word lines of pages other than the read target page. In this case, a voltage value (or voltage level) of the read voltage $V_{read}$ may be set to a default value.

The memory controller 200 may perform recovery (S970). The memory controller 200 may recover the bit to be corrected using the ECC. In addition, the memory controller 200 may perform recovery by reclaiming the data of the worn-out UECC page or the data of an adjacent page of the worn-out UECC page to another page in which wear-out has not occurred. The memory controller 200 may also perform reclaim with a memory block unit. For example, the memory controller 200 may move data of a memory block including worn-out UECC pages to another memory block in which wear-out has not occurred.

Figure 12:
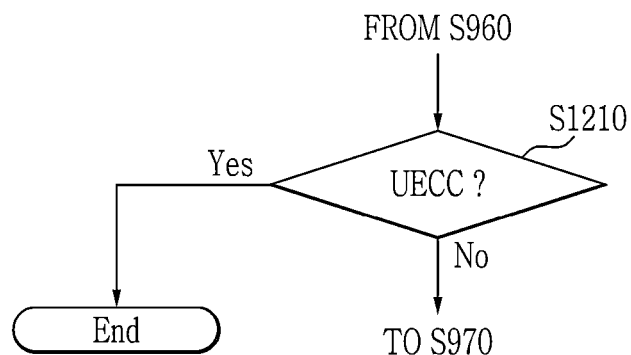
FIG. 12 shows a flowchart of a data recovery method according to an embodiment.

FIG. 12 shows a flowchart of a data recovery method according to an embodiment. Referring to FIG. 12, in order to read data of an adjacent page, the memory controller 200 determines a read pass voltage $V_{RDPS}$ and applies the determined read pass voltage $V_{RDPS}$ to word lines corresponding to pages excluding the adjacent page (S960), and then the memory controller 200 may determine whether a memory block in which the adjacent page is included corresponds to the UECC (S1210). For example, when the memory controller 200 applies the determined read pass voltage $V_{RDPS}$ to read a plurality of pages of the memory block, at least one page in which data cannot be read may exist due to other reasons such as wear-out.

When the memory block corresponds to the UECC, the memory controller 200 may terminate the recovery procedure. The memory controller 200 may designate a memory block that is a UECC as a prohibited block. However, when the memory block does not correspond to the UECC, the memory controller 200 may perform recovery (S970).

Figure 13:
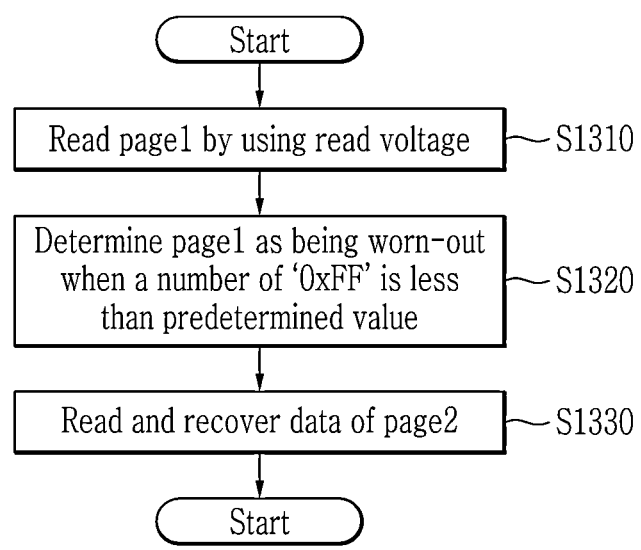
FIG. 13 shows a flowchart of a data recovery method according to an embodiment.

FIG. 13 shows a flowchart of a data recovery method according to an embodiment. Referring to FIG. 13, a memory controller 200 may read a first page using a read voltage (S1310). The read voltage is a voltage applied to a word line of the first page to be read, and may exceed a threshold voltage of a normal memory cell. Selectively, the memory controller 200 may use a read voltage to determine whether the first page includes UECC data before reading the first page. When the first page includes UECC data, the memory controller 200 may read the first page using a read voltage. The memory controller 200 may determine whether the first page includes UECC data by using several voltages lower than a threshold voltage of a normal memory cell.

When the number of "0xFF" data in the first page is less than a first predetermined number, the memory controller 200 may determine that the first page includes the worn-out memory cell (S1320). The first predetermined number may be a number determined in proportion to the number of data of the first page. For example, when the data of the first page is 4 kB, the predetermined number may be 4*0.99 kB.

The memory controller 200 may read a second page adjacent to the first page and recover data (S1330). In this case, the memory controller 200 may determine a pass voltage applied to word lines of pages other than the second page. The memory controller 200 may read the data of the second page by applying the read voltage to the second page and the determined pass voltage to other pages.

For example, the memory controller 200 may determine a pass voltage at which the number of "0xFF" data in the second page exceeds a second predetermined number when reading the second page while adjusting the pass voltage. The memory controller 200 may increase the pass voltage at a predetermined interval. The second predetermined number may be a number determined in proportion to the number of data of the first page. Depending on embodiments, the first predetermined number and the second predetermined number may be the same.

Figure 14:
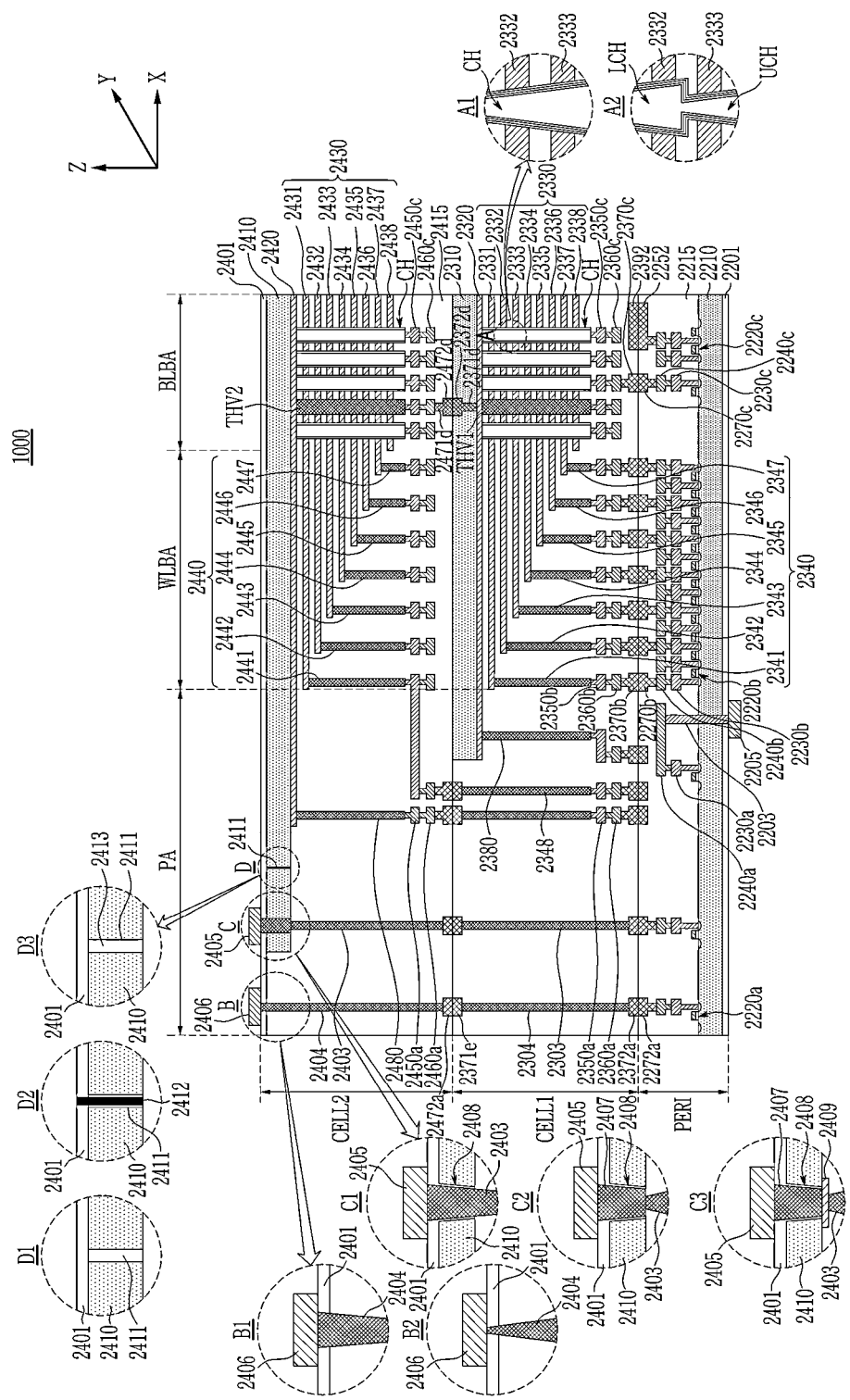
FIG. 14 shows a memory device according to an embodiment.

FIG. 14 shows a memory device according to an embodiment. Specifically, a memory device 1000 according to an embodiment of the present invention may include at least one of chips including a cell area. For example, as shown in FIG. 14, the memory device 1000 may be implemented to include two upper chips. However, this is only an example, and the number of upper chips is not limited thereto. When the memory device 1000 is implemented to include two upper chips, a first upper chip including a first cell area CELL1, a second upper chip including a second cell area CELL2, and a lower chip including a peripheral circuit area PERI are respectively manufactured, and then the first upper chip, the second upper chip, and the lower chip are connected to each other by a bonding method such that the memory device 1000 can be manufactured. The first upper chip may be inverted and connected to the lower chip in a bonding manner, and the second upper chip may also be inverted and connected to the first upper chip in a bonding manner. In the following description, the upper and lower directions are indicated based on before the first upper chip and the second upper chip are inverted. That is, an upper portion of the lower chip means the Z-axis direction, and an upper portion of the first and second upper chips means the −Z-axis direction. However, the present invention is not limited thereto, and only one of the first upper chip and the second upper chip may be inverted and connected in a bonding manner.

The peripheral circuit area PERI and each of the first and second cell areas CELL1 and CELL2 of the memory device 1000 may include an external pad bonding area PA, a word line bonding area WLBA, and a bit line bonding area BLBA. The peripheral circuit area PERI may include a first substrate 2210 and a plurality of circuit elements 2220a, 2220b, and 2220c formed on the first substrate 2210. At least one interlayer insulation layer 2215 may be provided on the plurality of circuit elements 2220a, 2220b, and 2220c, and a plurality of metal wires that connect the plurality of circuit elements 2220a, 2220b, and 2220c may be provided on the interlayer insulation layer 2215. For example, the plurality of metal wires may include first metal wires 2230a, 2230b, and 2230c respectively connected to the plurality of circuit elements 2220a, 2220b, and 2220c, and second metal wires 2240a, 2240b, and 2240c formed on the first metal wires 2230a, 2230b, and 2230c. The plurality of metal wires may be formed of various conductive materials. For example, the first metal wires 2230a, 2230b, and 2230c may be formed of tungsten having relatively high electrical resistivity, and the second metal wires 2240a, 2240b, and 2240c may be formed of copper having relatively low electrical resistivity.

In the present embodiment, only the first metal wires 2230a, 2230b, and 2230c and the second metal wires 2240a, 2240b, and 2240c are illustrated and described, but is not limited thereto, and at least one metal wire may be formed on the second metal wires 2240a, 2240b, and 2240c. In this case, the second metal wires 2240a, 2240b, and 2240c may be formed of aluminum. In addition, at least a part of the at least one metal wire on the second metal wires 2240a, 2240b, and 2240c may be formed of copper and the like having lower electrical resistivity than the aluminum of the second metal wires 2240a, 2240b, and 2240c. The interlayer insulation layer 2215 is disposed on the first substrate 2210, and may include an insulating material such as a silicon oxide or a silicon nitride.

The first and second cell areas CELL1 and CELL2 may provide at least one memory block. The first cell area CELL1 may include a second substrate 2310 and a common source line 2320. A plurality of word lines 2330 (2331 to 2338) may be stacked on the second substrate 2310 in a direction (Z-axis direction) that is perpendicular to an upper surface of the second substrate 2310. String select lines SSL and a ground select line GSL may be disposed on upper and lower portions of the word lines 2330, and the plurality of word lines 2330 may be disposed between the string select lines SSL and the ground select line GSL. Similarly, the second cell area CELL2 includes a third substrate 2410 and a common source line 2420, and a plurality of word lines 2430 (2431 to 2438) are stacked in a direction (Z-axis direction) that is perpendicular to the upper surface of the third substrate 2410. The second substrate 2310 and the third substrate 2410 may be formed of various materials, for example, a silicon substrate, a silicon-germanium substrate, a germanium substrate, or a substrate having a single crystal epitaxial layer grown on a monocrystalline silicon substrate. A plurality of channel structures CH may be formed in each of the first and second cell areas CELL1 and CELL2.

In an embodiment, as shown in A1, the channel structure CH is provided in the bit line bonding area BLBA, and extends in the vertical direction to the upper surface of the second substrate 2310 to penetrate the word lines 2330, the string select lines, and the ground select lines. The channel structure CH may include a data storage layer, a channel layer, and a fill insulation layer. The channel layer may be electrically connected to the first metal wire 2350c and the second metal wire 2360c in the bit line bonding area BLBA. For example, the second metal wire 2360c may be a bit line, and may be connected to the channel structure CH through the first metal wire 2350c. The bit line 2360c may extend along a first direction (Y-axis direction) parallel to the upper surface of the second substrate 2310.

In an embodiment, as shown in A2, the channel structure CH may include a lower channel LCH and an upper channel UCH connected to each other. For example, the channel structure CH may be formed through a process for a lower channel LCH and a process for an upper channel UCH. The lower channel LCH may extend in a direction that is perpendicular to the upper surface of the second substrate 2310 and penetrate the common source line 2320 and lower word lines 2331 and 2332. The lower channel LCH may include a data storage layer, a channel layer and a fill insulation layer, and the like, and may be connected to the upper channel UCH. The upper channel UCH may pass through upper word lines 2333 to 2338. The upper channel UCH may include a data storage layer, a channel layer and a fill insulation layer, and the like, and the channel layer of the upper channel UCH may be electrically connected to the first metal wire 2350c and the second metal wire 2360c. As a length of the channel increases, it may be difficult to form a channel having a constant width due to process reasons. The memory device 1000 according to the embodiment of the present invention may have a channel having improved width uniformity through the lower channel LCH and the upper channel UCH formed in a sequential process.

As shown in A2, when the channel structure CH is formed to include the lower channel LCH and the upper channel UCH, the word line positioned near the boundary of the lower channel LCH and the upper channel UCH may be a dummy word line. For example, the word line 2332 and the word line 2333 forming the boundary between the lower channel LCH and the upper channel UCH may be dummy word lines. In this case, data may not be stored in memory cells connected to the dummy word line. Alternatively, the number of pages formed by memory cells connected to a dummy word line may be less than the number of pages formed by memory cells connected to a normal word line. A voltage level applied to the dummy word line may be different from a voltage level applied to the normal word line, and accordingly, the influence of the non-uniform channel width between the lower channel LCH and the upper channel UCH on the operation of the memory device may be reduced.

Meanwhile, in A2, the number of lower word lines 2331 and 2332 penetrated by the lower channel LCH is shown to be smaller than that of the upper word lines 2333 to 2338 penetrated by the upper channel UCH. However, this is an example, and the present invention is not limited thereto. As another example, the number of lower word lines passing through the lower channel LCH may be formed to be equal to or greater than the number of upper word lines passing through the upper channel UCH. In addition, the structure and connection relationship of the channel structure CH disposed to the first cell area CELL1 described above may be equally applied to the channel structure CH disposed to the second cell area CELL2.

In the bit line bonding area BLBA, a first through electrode THV1 may be provided in the first cell area CELL1, and a second through electrode THV2 may be provided in the second cell area CELL2. As shown in FIG. 14, the first through electrode THV1 may pass through the common source line 2320 and the plurality of word lines 2330. However, this is an example, and the first through electrode THV1 may further penetrate the second substrate 2310. The first through electrode THV1 may include a conductive material. Alternatively, the first through electrode THV1 may include a conductive material surrounded by an insulating material. The second through electrode THV2 may also be provided in the same shape and structure as the first through electrode THV1.

In an embodiment, the first through electrode THV1 and the second through electrode THV2 may be electrically connected through a first through metal pattern 2372*d* and a second through metal pattern 2472*d*. The first through metal pattern 2372*d* may be formed on a lower portion of the first upper chip including the first cell area CELL1, and the second through metal pattern 2472*d* may be formed on the upper side of the second upper chip including the second cell area CELL2. The first through electrode THV1 may be electrically connected to the first metal wire 2350*c* and the second metal wire 2360*c*. A lower via 2371*d* may be formed between the first through electrode THV1 and the first through metal pattern 2372*d*, and an upper via 2471*d* may be formed between the second through electrode THV2 and the second through metal pattern 2472*d*. The first through metal pattern 2372*d* and the second through metal pattern 2472*d* may be connected by a bonding method.

In addition, in the bit line bonding area BLBA, an upper metal pattern 2252 is formed on the uppermost metal layer of the peripheral circuit area PERI, and an upper metal pattern 2392 having the same shape as the upper metal pattern 2252 is formed on the uppermost metal layer of the first cell area CELL1. The upper metal pattern 2392 of the first cell area CELL1 and the upper metal pattern 2252 of the peripheral circuit area PERI may be electrically connected to each other by a bonding method. In the bit line bonding area BLBA, the bit line 2360*c* may be electrically connected to a page buffer included in the peripheral circuit area PERI. For example, some of the circuit elements 2220*c* of the peripheral circuit area PERI may provide a page buffer, and the bit line 2360*c* may be electrically connected to circuit elements 2220*c* that provide a buffer page through the upper bonding metal 2370*c* of the first cell area CELL1 and the upper bonding metal 2270*c* of the peripheral circuit area PERI.

Continuously, referring to FIG. 14, in the word line bonding area WLBA, the word lines 2330 of the first cell area CELL1 may extend along a second direction (X-axis direction) that is parallel to the upper surface of the second substrate 2310, and may be connected with a plurality of cell contact plugs 2340 (2341 to 2347). The first metal wire 2350*b* and the second metal wire 2360*b* may be sequentially connected to upper portions of the cell contact plugs 2340 connected to the word lines 2330. The cell contact plugs 2340 may be connected to the peripheral circuit area PERI through the upper bonding metal 2370*b* of the first cell area CELL1 and the upper bonding metal 2270*b* of the peripheral circuit area PERI in the word line bonding area WLBA.

The cell contact plugs 2340 may be electrically connected to a row decoder included in the peripheral circuit area PERI. For example, some of the circuit elements 2220*b* of the peripheral circuit area PERI provide a row decoder, and the cell contact plugs 2340 may be electrically connected to circuit elements 2220*b* providing a row decoder through the upper bonding metal 2370*b* of the first cell area CELL1 and the upper bonding metal 2270*b* of the peripheral circuit area PERI. In an embodiment, an operating voltage of the circuit elements 2220*b* providing the row decoder may be different from an operating voltage of the circuit elements 2220*c* providing the page buffer. For example, the operating voltage of the circuit elements 2220*c* providing the page buffer may be greater than the operating voltage of the circuit elements 2220*b* providing the row decoder.

Similarly, in the word line bonding area WLBA, the word lines 2430 of the second cell area CELL2 may extend along the second direction (X-axis direction) that is parallel to the upper surface of the third substrate 2410, and may be connected with a plurality of cell contact plugs 2440 (2441 to 2447). The cell contact plugs 2440 may be connected to the peripheral circuit area PERI through the upper metal pattern of the second cell area CELL2, the lower metal pattern, the upper metal pattern of the first cell area CELL1, and the cell contact plug 2348.

In the word line bonding area WLBA, an upper bonding metal 2370*b* may be formed in the first cell area CELL1, and an upper bonding metal 2270*b* may be formed in the peripheral circuit area PERI. The upper bonding metal 2370*b* of the first cell area CELL1 and the upper bonding metal 2270*b* of the peripheral circuit area PERI may be electrically connected to each other by a bonding method. The upper bonding metal 2370*b* and the upper bonding metal 2270*b* may be formed of aluminum, copper, tungsten, and the like.

In an external pad bonding area PA, a lower metal pattern 2371*e* may be formed on a lower portion of the first cell area CELL1, and an upper metal pattern 2472*a* may be formed on an upper portion of the second cell area CELL2. The lower metal pattern 2371*e* of the first cell area CELL1 and the upper metal pattern 2472*a* of the second cell area CELL2 may be connected by a bonding method in the external pad bonding area PA. Similarly, an upper metal pattern 2372*a* may be formed on an upper portion of the first cell area CELL1, and an upper metal pattern 2272*a* may be formed on an upper portion of the peripheral circuit area PERI. The upper metal pattern 2372*a* of the first cell area CELL1 and the upper metal pattern 2272*a* of the peripheral circuit area PERI may be connected by a bonding method.

Common source line contact plugs 2380 and 2480 may be disposed in the external pad bonding area PA. The common source line contact plugs 2380 and 2480 may be formed of a conductive material such as a metal, a metal compound, or polysilicon. The common source line contact plug 2380 of the first cell area CELL1 may be electrically connected to the common source line 2320, and the common source line contact plug 2480 of the second cell area CELL2 may be electrically connected to the common source line 2420. The first metal wire 2350*a* and the second metal wire 2360*a* may be sequentially stacked on the common source line contact plug 2380 of the first cell area CELL1, and the first metal wire 2450*a* and the second metal wire 2460*a* may be sequentially stacked on the common source line contact plug 2480 of the second cell area CELL2.

In the external pad bonding area PA, input and output pads 2205, 2405, and 2406 may be disposed. Referring to FIG. 14, a lower insulation layer 2201 covering a lower surface of the first substrate 2210 may be formed on a lower portion of the first substrate 2210, and a first input and output pad 2205 may be formed on the lower insulation layer 2201. The first input and output pad 2205 is connected to at least one of a plurality of circuit elements 2220*a* disposed in the peripheral circuit area PERI through the first input and output contact plug 2203, and may be separated from the first substrate 2210 by the lower insulation layer 2201. In addition, a side insulation layer is disposed between the first input and output contact plug 2203 and the first substrate 2210 to electrically separate the first input and output contact plug 2203 and the first substrate 2210.

An upper insulation layer 2401 covering an upper surface of the third substrate 2410 may be formed on the upper portion of the third substrate 2410. A second input and output pad 2405 and/or a third input and output pad 2406 may be disposed on the upper insulation layer 2401. The second input and output pad 2405 is connected to at least one of the plurality of circuit elements 2220*a* disposed in the peripheral circuit area PERI through the second input and output contact plugs 2403 and 2303, and the third input and output pad 2406 may be connected to at least one of the plurality of circuit elements 2220*a* disposed in the peripheral circuit area PERI through the third input and output contact plugs 2404 and 2304.

In an embodiment, the third substrate 2410 may not be disposed in the region where the input and output contact plugs are disposed. For example, as shown in B, the third input and output contact plug 2404 is separated from the third substrate 2410 in a direction that is parallel to the upper surface of the third substrate 2410, and may be connected to the third input and output pad 2406 by penetrating the interlayer insulation layer 2415 of the second cell area CELL2. In this case, the third input and output contact plug 2404 may be formed by various processes.

As an example, as shown in B1, the third input and output contact plug 2404 extends in a third direction (Z-axis direction), and may be formed with a diameter that increases toward the upper insulation layer 2401. That is, the diameter of the channel structure CH described in A1 is formed to decrease toward the upper insulation layer 2401, whereas the diameter of the third input and output contact plug 2404 may be formed to increase toward the upper insulation layer 2401. For example, the third input and output contact plug 2404 may be formed after the second cell area CELL2 and the first cell area CELL1 are combined in a bonding manner.

In addition, as an example, as shown in B2, the third input and output contact plug 2404 extends in the third direction (Z-axis direction), and may be formed with a diameter that decreases toward the upper insulation layer 2401. That is, the diameter of the third input and output contact plug 2404 may be formed to become smaller toward the upper insulation layer 2401 like the channel structure CH. For example, the third input and output contact plug 2404 may be formed together with the cell contact plugs 2440 before between the second cell area CELL2 and the first cell area CELL1 are combined by bonding.

In another embodiment, the input and output contact plugs may be disposed to overlap the third substrate 2410. For example, as shown in C, the second input and output contact plug 2403 is formed by penetrating the interlayer insulation layer 2415 of the second cell area CELL2 in the third direction (Z-axis direction), and may be electrically connected with the second input and output contact plug 2403 through the third substrate 2410. In this case, the connection structure of the second input and output contact plug 2403 and the second input and output pad 2405 may be implemented in various ways.

As an example, as shown in C1, an opening 2408 penetrating through the third substrate 2410 is formed, and the second input and output contact plug 2403 may be directly connected to the second input and output pad 2405 through the opening 2408 formed in the third substrate 2410. In this case, as shown in C1, the diameter of the second input and output contact plug 2403 may be formed to increase toward the second input and output pad 2405. However, this is an example, and the diameter of the second input and output contact plug 2403 may be formed to decrease toward the second input and output pad 2405.

As an example, as shown in C2, the opening 2408 penetrating through the third substrate 2410 may be formed, and a contact 2407 may be formed in the opening 2408. One end of the contact 2407 may be connected to the second input and output pad 2405, and the other end may be connected to the second input and output contact plug 2403. Accordingly, the second input and output contact plug 2403 may be electrically connected to the second input and output pad 2405 through the contact 2407 in the opening 2408. In this case, as shown in C2, a diameter of the contact 2407 may be increased toward the second input and output pad 2405, and a diameter of the second input and output contact plug 2403 may be formed to decrease toward the second input and output pad 2405. For example, the third input and output contact plug 2403 is formed together with the cell contact plugs 2440 before the second cell area CELL2 and the first cell area CELL1 are combined by bonding, and the contact 2407 may be formed after the second cell area CELL2 and the first cell area CELL1 are combined by bonding.

Also, as an example, as shown in C3, a stopper 2409 may be further formed on an upper surface of the opening 2408 of the third substrate 2410 compared to that of C2. The stopper 2409 may be a metal wire formed on the same layer as the common source line 2420. However, this is only an example, and the stopper 2409 may be a metal wire formed on the same layer as at least one of the word lines 2403. The second input and output contact plug 2403 may be electrically connected to the second input and output pad 2405 through the contact 2407 and the stopper 2409.

On the other hand, similar to the second and third input and output contact plugs 2403 and 2404 of the second cell area CELL2, the second and third input and output contact plugs 2303 and 2304 of the first cell area CELL1 may be formed with a diameter that increases toward as the lower metal pattern 2371e or it may be formed to become smaller or increases toward the lower metal pattern 2371e, respectively.

Meanwhile, depending on embodiments, a slit 2411 may be formed on the third substrate 2410. For example, the slit 2411 may be formed at any position in the external pad bonding area PA. For example, as shown in D, the slit 2411 may be positioned between the second input and output pad 2405 and the cell contact plugs 2440 in a plan view. However, this is an example, and when viewed in a plan view, the slit 2411 may be formed such that the second input and output pad 2405 may be positioned between the slit 2411 and the cell contact plugs 2440.

As an example, as shown in D1, the slit 2411 may be formed to penetrate the third substrate 2410. The slit 2411, for example, may be used to prevent the substrate 2410 from being finely cracked when forming the opening 2408. However, this is an example, and the slit 2411 may be formed to a depth of about 60 to 70% of the thickness of the third substrate 2410.

In addition, for example, as shown in D2, a conductive material 2412 may be formed in the slit 2411. The conductive material 2412, for example, may be used for discharging a leakage current generated during driving of circuit elements in the external pad bonding area PA to the outside. In this case, the conductive material 2412 may be connected to an external ground line.

In addition, as an example, as shown in D3, an insulating material 2413 may be formed in the slit 2411. The insulating material 2413, for example, may be formed to electrically separate the second input and output pad 2405 and second input and output contact plug 2403 disposed in the external pad bonding area PA from the word line bonding area WLBA. Since the insulating material 2413 is formed in the slit 2411, it is possible to block the voltage provided through the second input and output pad 2405 from affecting the metal layer of the word line bonding area WLBA disposed on the upper surface of the third substrate 2410.

Meanwhile, depending on embodiments, the first to third input and output pads 2205, 2405, and 2406 may be selectively formed. For example, the memory device 500 may be implemented to include only the first input and output pad 2205 that is disposed on an upper portion of the first substrate 2201, to include only the second input and output pad 2405 that is disposed on an upper portion of the third substrate 2410, or to include only the third input and output pad 2406 that is disposed on an upper portion of the upper insulation layer 2401.

On the other hand, depending on embodiments, at least one of the second substrate 2310 of the first cell area CELL1 and the third substrate 2410 of the second cell area CELL2 may be used as a sacrificial substrate, and may be completely or only partially removed before or after the bonding process. After removing the substrate, an additional layer may be laminated. For example, the second substrate 2310 of the first cell area CELL1 may be removed before or after bonding of the peripheral circuit area PERI and the first cell area CELL1, and an insulation layer covering the upper surface of the common source line 2320 or a conductive layer for connection may be formed. Similarly, the third substrate 2410 of the second cell area CELL2 may be removed before or after bonding of the first cell area CELL1 and the second cell area CELL2, and an upper insulation layer 2401 covering the upper surface of the common source line 2420 or a conductive layer for connection may be formed.

Figure 15:
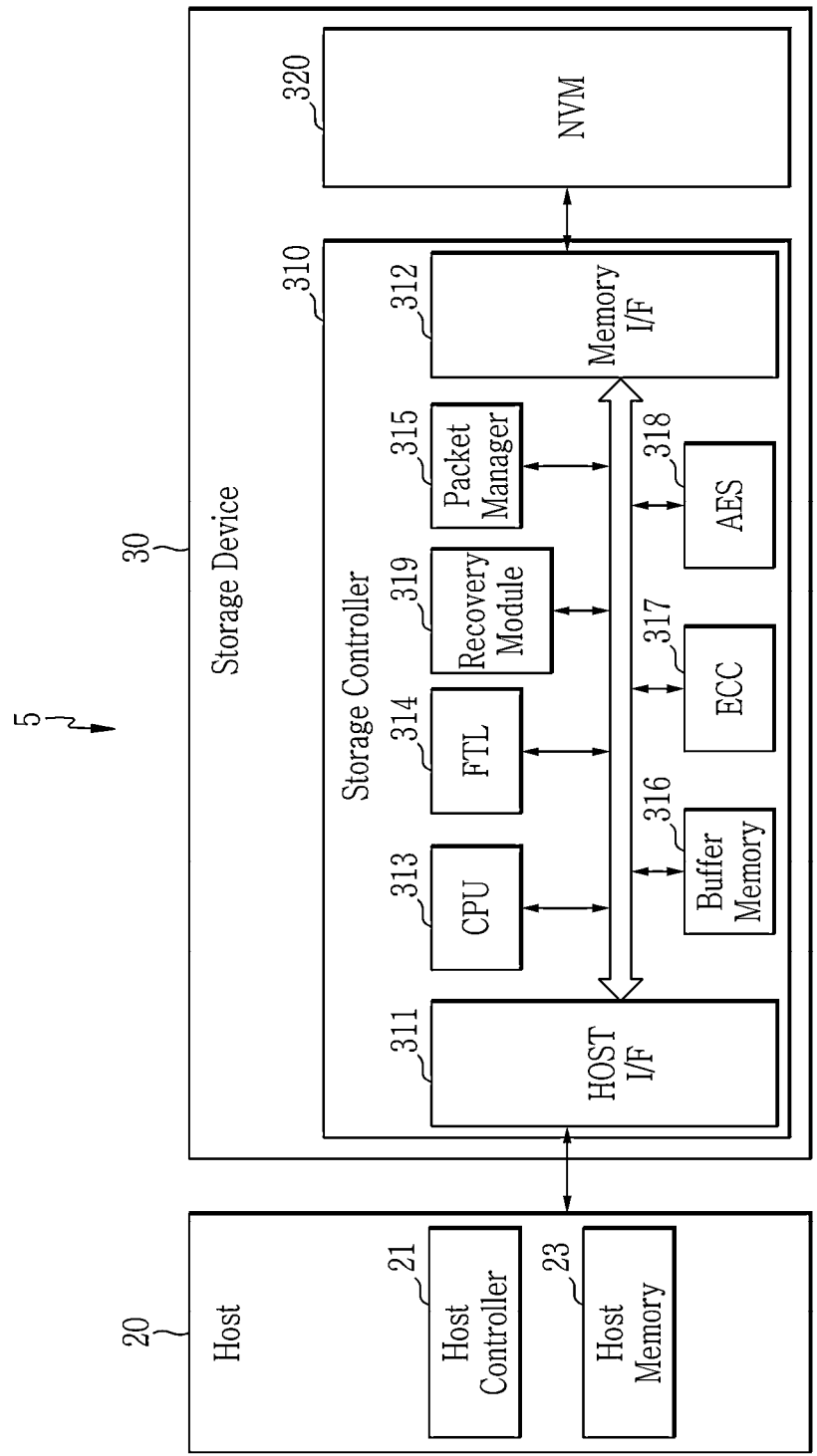
FIG. 15 is a schematic block diagram of a computing system according to an embodiment.

FIG. 15 is a schematic block diagram of a computing system according to an embodiment. Referring to FIG. 15, a computing system 5 may be implemented as a personal computer (PC) or a data server, a laptop computer, or a portable device. The portable device may be implemented as a mobile phone, a smart phone, a tablet PC, a wearable device, a personal digital assistant (PDA), an enterprise digital assistant (EDA), a digital still camera, a digital video camera, a portable multimedia player (PMP), a personal navigation device, a portable navigation device (PND), a handheld game console, or an e-book. In addition, the computing system 5 may be implemented as a system-on-a-chip (SoC).

The computing system 5 may include a host 20 and a storage device 30. The host 10 may communicate with the storage device 30 through various interfaces. The host 10 may request a data processing operation, for example, a data read operation, a data write operation, and a data erase operation from the storage device 30. For example, the host 10 may be a CPU, a GPU, a microprocessor, or an AP. The storage device 30 may be implemented to include the memory system 10 described with reference to FIG. 1 to FIG. 12.

The host 20 may include a host controller 21 and a host memory 23. The host memory 23 may function as a buffer memory for temporarily storing data to be transmitted to the storage device 30 or data transmitted from the storage device 30.

The storage device 30 may include a storage controller 310 and a non-volatile memory (NVM) 320. The storage device 30 may include storage media for storing data according to a request from the host 20. For example, the storage device 30 may be implemented in various types such as an SSD, an eMMC, a UFS, a CF, an SD, a Micro-SD, a Mini-SD, xD, or a memory stick.

When the storage device 30 is an SSD, the storage device 30 may be a device conforming to a non-volatile memory express (NVMe) standard. When the storage device 30 is an embedded memory or an external memory, the storage device 30 may be a device conforming to the UFS standard or the eMMC standard. The host 20 and the storage device 30 may generate and transmit a packet according to an adopted standard protocol, respectively.

When the non-volatile memory 320 of the storage device 30 includes a flash memory, the flash memory may include a 2D NAND memory array or a 3D NAND memory array. As another example, the storage device 30 may include other various types of non-volatile memories. For example, the storage device 30 may include various other types of memory such as an MRAM, an STT-RAM, a CBRAM, an FeRAM, a PRAM, and a RRAM.

In some embodiments, the host controller 21 and the host memory 23 may be implemented as separate semiconductor chips. Alternatively, in some embodiments, the host controller 21 and the host memory 23 may be integrated on the same semiconductor chip. As an example, the host controller 21 may be any one of a plurality of modules provided in the AP, and the AP may be implemented as an SoC. In addition, the host memory 23 may be an embedded memory provided in the AP or a non-volatile memory or memory module disposed outside the AP.

The host controller 21 stores the data (e.g., write data) of a buffer region in the non-volatile memory 320 or manages operation for storing the data (e.g., read data) of the non-volatile memory 320 in the buffer region. The storage controller 310 may include a host interface 311, a memory interface 312, and a CPU 313. In addition, the storage controller 310 may further include a flash translation layer (FTL) 314), a packet manager 315, a buffer memory 316, an error correction code (ECC) engine 317, an advanced encryption standard (AES) engine 318, and a recovery module 319. The storage controller 310 may further include a working memory into which the FTL 314 is loaded, and the data write operation and read operation to the non-volatile memory may be controlled by the CPU 313 executing the flash conversion layer 314.

The host interface 311 may transmit/receive packets to/from the host 20. A packet transmitted from the host 20 to the host interface 311 may include a command or data to be written to the non-volatile memory 320, and the packet transmitted from the host interface 311 to the host 20 may include a response to the command or data read from the non-volatile memory 320.

The memory interface 312 may transmit data to be written to the non-volatile memory 320 to the non-volatile memory 320 or receive data read from the non-volatile memory 320. The memory interface 312 may be implemented to comply with a standard protocol such as toggle or ONFI. The flash translation layer 314 may perform various functions such as address mapping, wear-leveling, and garbage collection. The address mapping operation is an operation of changing a logical address received from the host into a physical address used to actually store data in the non-volatile memory 320. The wear-leveling is a technology to prevent excessive degradation of a specific block by ensuring that the blocks in the non-volatile memory 320 are used uniformly, and may be implemented through firmware technology that balances the erase counts of physical blocks. The garbage collection is a technique to secure usable capacity in the non-volatile memory 320 by copying the valid data of a block to a new block and then erasing the existing block.

The packet manager 315 may generate a packet according to a protocol of an interface negotiated with the host 20 or parse various types of information from a packet received from the host 20. In addition, the buffer memory 316 may temporarily store data to be written to the non-volatile memory 320 or data to be read from the non-volatile memory 320. The buffer memory 316 may have a configuration provided in the storage controller 310, but may be disposed outside the storage controller 310.

The ECC engine 317 may perform an error detection and correction function for read data read from the non-volatile memory 320, as described hereinabove. More specifically, the ECC engine 317 may generate parity bits for write data to be written into the non-volatile memory 320, and the generated parity bits are stored in the non-volatile memory 320 together with the write data. When reading data from the non-volatile memory 320, the ECC engine 317 uses the parity bits read from the non-volatile memory 320 together with the read data to correct an error in the read data and output the error-corrected read data.

The AES engine 318 may perform at least one of an encryption operation and a decryption operation for data input to the storage controller 310 using a symmetric-key algorithm. The recovery module 319 may be implemented in hardware, firmware, or software and run in the storage device 30. The recovery module 319 may recover the data of the memory block where degradation occurred in the non-volatile memory 320 and move the recovered data to the normal memory block. The description of the recovery module 210 of FIG. 1 may be equally applied to the recovery module 319.

In some embodiments, each constituent element or the combination of constituent elements of two or more described with reference to FIG. 1 to FIG. 15 can be implemented as a digital circuit, a programmable or non-programmable logic device or array, an application specific integrated circuit (ASIC), and the like.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A method of operating a memory device, comprising:
reading a first page of memory cells containing at least one worn-out memory cell therein using a read voltage, from a first memory block;
reading a second page of memory cells, which extends adjacent to the first page in the first memory block, using the read voltage;
determining a match rate between a position of a column including a "0" bit in the first page with a position of an equivalent column including a "0" bit in the second page, for each of the columns associated with the first and second pages, where the match rate corresponds to a ratio between: (i) a number of columns having matching "0" bits in the first and second pages, and (ii) a number of total columns within the first and second pages; and then
reading the second page by adjusting a read pass voltage applied to a word line of another page in the first memory block, when the match rate exceeds a threshold match rate.

2. The method of claim 1, wherein the threshold match rate is at least 90%.

3. The method of claim 1, wherein a voltage value of the read voltage is set to a predefined default value.

4. The method of claim 1, wherein said reading the second page by adjusting the read pass voltage, comprises:
adjusting the read pass voltage;
applying the adjusted read pass voltage to the word line of at least the first other page; and
reading the second page by applying the read voltage to a word line of the second page.

5. The method of claim 1, wherein said reading the second page by adjusting the read pass voltage, comprises:
determining a read pass voltage value at which a number of "0" bits in the second page is smaller than a predetermined number; and
reading the second page by setting the read pass voltage value as the read pass voltage.

6. The method of claim 5, wherein the predetermined number is less than a maximum number of bits that is correctable using an error correction code (ECC).

7. The method of claim 1, wherein said reading the first page comprises reading the first page by applying the read voltage to a word line of the first page, and applying the read pass voltage to a word line of the second page; and wherein said reading the second page of memory cells using a read voltage comprises reading the second page by applying the read voltage to the word line of the second page, and applying the read pass voltage to the word line of the first page.

8. The method of claim 1, wherein said reading the second page by adjusting the read pass voltage comprises reading the second page repeatedly while incrementally adjusting the read pass voltage at predetermined intervals.

9. The method of claim 1, wherein said reading the first page comprises determining whether a number of "0" bits in the first page exceeds a predetermined number; and wherein said reading the second page of memory cells using a read voltage is performed when the number of "0" bits in the first page exceeds the predetermined number.

10. The method of claim 9, wherein the predetermined number is less than a maximum number of bits that is correctable using an error correction code (ECC).

11. The method of claim 1, further comprising:
recovering data stored in the second page using an error correction code (ECC); and
writing the recovered data of the second page to a second memory block.

12. The method of claim 11, further comprising:
determining whether the first memory block is an uncorrectable ECC (UECC) block; and
wherein said writing the recovered data comprises writing the recovered data of the second page to the second memory block when the first memory block is an uncorrectable ECC block.

13. A semiconductor device, comprising:
a memory device having a memory cell array therein; and
a memory controller electrically coupled to said memory device, said memory controller configured to:
read a first page of memory cells containing at least one worn-out memory cell therein using a read voltage, from a first memory block;
read a second page of memory cells, which is adjacent to the first page in the first memory block, using the read voltage, wherein the first page and the second page share a plurality of columns;
determine a match rate based on a ratio of a first number of columns where both the first and second pages include a "0" bit to a second number of the plurality of columns;
read the second page by adjusting a read pass voltage applied to a word line of another page in the first memory block, when the match rate exceeds a threshold match rate.

14. The device of claim 13, wherein the memory controller is configured to read the second page by adjusting the read pass voltage, by:
adjusting the read pass voltage;
applying the adjusted read pass voltage to the word line of at least the first page; and
reading the second page by applying the read voltage to a word line of the second page.

15. The device of claim 13, wherein the memory controller is configured to read the second page by adjusting the read pass voltage, by:
determining a read pass voltage value at which a number of "0" bits in the second page is smaller than a predetermined number; and
reading the second page by setting the read pass voltage value as the read pass voltage.

16. The device of claim 13, wherein the memory controller is configured to:
determine whether a number of "0" bits in the first page exceeds a predetermined number; and
read the second page of memory cells using a read voltage when the number of "0" bits in the first page exceeds the predetermined number.

* * * * *